(12) United States Patent
Schricker et al.

(10) Patent No.: US 7,935,594 B2
(45) Date of Patent: *May 3, 2011

(54) DAMASCENE PROCESS FOR CARBON MEMORY ELEMENT WITH MIIM DIODE

(75) Inventors: April Dawn Schricker, Fremont, CA (US); Deepak C. Sekar, Sunnyvale, CA (US); Andy Fu, San Ramon, CA (US); Mark Clark, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/566,486

(22) Filed: Sep. 24, 2009

(65) Prior Publication Data

US 2010/0081268 A1    Apr. 1, 2010

Related U.S. Application Data

(63) Continuation of application No. 12/240,758, filed on Sep. 29, 2008, now Pat. No. 7,615,439.

(51) Int. Cl.
*H01L 21/8234* (2006.01)
(52) U.S. Cl. .................. 438/237; 438/328; 438/598
(58) Field of Classification Search .................. 438/121, 438/132, 237, 328, 598, 600, 601
See application file for complete search history.

(56) References Cited

U.S. PATENT DOCUMENTS

| | | | |
|---|---|---|---|
| 5,191,509 A | 3/1993 | Wen | |
| 5,841,150 A | 11/1998 | Gonzalez et al. | |
| 5,962,923 A | 10/1999 | Xu et al. | |
| 6,025,220 A | 2/2000 | Sandhu | |
| 6,331,944 B1 | 12/2001 | Monsma et al. | |
| 6,392,913 B1 | 5/2002 | Sandhu | |
| 6,777,773 B2 | 8/2004 | Knall | |
| 6,944,052 B2 | 9/2005 | Subramanian et al. | |

(Continued)

FOREIGN PATENT DOCUMENTS

| | | |
|---|---|---|
| EP | 1892722 A1 | 2/2008 |
| JP | 3045930 A | 2/1991 |
| JP | 3051823 A | 6/1991 |
| WO | 02095832 A2 | 11/2002 |

OTHER PUBLICATIONS

Office Action dated Jul. 8, 2010 in U.S. Appl. No. 12/240,766.

(Continued)

*Primary Examiner* — Kevin M Picardat
(74) *Attorney, Agent, or Firm* — Vierra Magen Marcus & DeNiro LLP

(57) ABSTRACT

Forming a metal-insulator diode and carbon memory element in a single damascene process is disclosed. A trench having a bottom and a sidewall is formed in an insulator. A first diode electrode is formed in the trench during a single damascene process. A first insulating region comprising a first insulating material is formed in the trench during the single damascene process. A second insulating region comprising a second insulating material is formed in the trench during the single damascene process. A second diode electrode is formed in the trench during the single damascene process. The first insulating region and the second insulating region reside between the first diode electrode and the second diode electrode to form a metal-insulator-insulator-metal (MIIM) diode. A region of carbon is formed in the trench during the single damascene process. At least a portion of the carbon is electrically in series with the MIIM diode.

20 Claims, 21 Drawing Sheets

U.S. PATENT DOCUMENTS

| | | |
|---|---|---|
| 6,980,466 B2 | 12/2005 | Perner et al. |
| 6,995,962 B2 | 2/2006 | Saito et al. |
| 7,030,405 B2 | 4/2006 | Campbell |
| 7,129,098 B2 | 10/2006 | Rizzo et al. |
| 7,135,696 B2 | 11/2006 | Karpov et al. |
| 7,388,276 B2 | 6/2008 | Estes |
| 7,615,439 B1 * | 11/2009 | Schricker et al. ............. 438/237 |
| 2002/0171078 A1 | 11/2002 | Eliasson et al. |
| 2004/0113235 A1 | 6/2004 | Coolbaugh et al. |
| 2004/0159828 A1 | 8/2004 | Rinerson et al. |
| 2005/0062098 A1 | 3/2005 | Mahajani et al. |
| 2005/0083760 A1 | 4/2005 | Subramanian et al. |
| 2006/0140005 A1 | 6/2006 | Yeh |
| 2006/0267086 A1 | 11/2006 | Furukawa et al. |
| 2007/0241319 A1 | 10/2007 | Chang |
| 2008/0217732 A1 | 9/2008 | Kreupl |
| 2009/0026434 A1 | 1/2009 | Malhotra et al. |
| 2009/0134450 A1 | 5/2009 | Kim et al. |

OTHER PUBLICATIONS

U.S. Appl. No. 12/240,785, filed Sep. 29, 2008.
U.S. Appl. No. 12/240,766, filed Sep. 29, 2008.
International Search Report and Written Opinion dated Nov. 26, 2009, International Application No. PCT/US2009/057701.
International Search Report and Written Opinion dated Dec. 1, 2009, International Application No. PCT/US2009/057704.
International Search Report and Written Opinion dated Nov. 30, 2009, International Application No. PCT/US2009/057696.
Response to Office Action filed Oct. 7, 2010 in U.S. Appl. No. 12/240,766.
Office Action dated Sep. 30, 2010 in U.S. Appl. No. 12/240,785.
Office Action dated May 26, 2010 in U.S. Appl. No. 12/240,766.
Response to Office Action filed Jun. 11, 2010 in U.S. Appl. No. 12/240,766.
Response to Office Action dated Dec. 15, 2010, U.S. Appl. No. 12/240,785, filed Sep. 29, 2008.
Office Action dated Jan. 4, 2011, U.S. Appl. No. 12/240,766, filed Sep. 29, 2008.
Response to Office Action dated Jan. 24, 2011, U.S. Appl. No. 12/240,766, filed Sep. 29, 2008.
Notice of Allowance and Fee(s) Due dated Mar. 15, 2011, U.S. Appl. No. 12/240,785, filed Sep. 29, 2008.

* cited by examiner

DAMASCENE PROCESS FOR CARBON MEMORY ELEMENT WITH MIIM DIODE

PRIORITY DATA

This application is a continuation of U.S. patent application Ser. No. 12/240,758 entitled "DAMASCENE PROCESS FOR CARBON MEMORY ELEMENT WITH MIIM DIODE," filed on Sep. 29, 2008, now pending.

CROSS-REFERENCE TO RELATED APPLICATIONS

The following related applications are cross-referenced and incorporated by reference herein in their entireties:

U.S. patent application Ser. No. 12/240,785 entitled "MIIM DIODES HAVING STACKED STRUCTURE," filed on Sep. 29, 2008; and U.S. patent application Ser. No. 12/240,766 entitled "IMPROVED MIIM DIODES," filed on Sep. 29, 2008.

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, some materials (e.g., carbon) can be switched between low and high resistance states. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory device. Diodes or other devices having a non-linear conduction current are typically used as the steering element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contact with the conductor forming the respective bit line.

One type of diode that might be used for the steering element is a metal insulator metal diode. Metal insulator diodes may have more than one insulating layer. Thus, as the term is used herein "metal-insulator diode" includes diodes with one or more insulator layers. For example, one configuration is a metal-insulator-insulator-metal diode (MIIM diode). Unfortunately, forming MIIM diodes that have good "on current" and rectification ratios is challenging. As scaling of devices to smaller feature sizes continues, there is a need for diodes with good rectification behavior and smaller aspect ratios.

Moreover, it is desirable that the techniques used to form switchable memory elements are compatible with techniques used to form steering elements, such as MIIM diodes.

DETAILED DESCRIPTION

A method of forming a memory cell having a metal-insulator diode and carbon memory element in a single damascene process is disclosed. The method of forming the carbon memory element is compatible with forming metal-insulator diodes which have small aspect ratios and thin diode stacks. Moreover, a single damascene approach allows the memory cell to be formed with fewer etches and cleans than other techniques.

Figure 1:
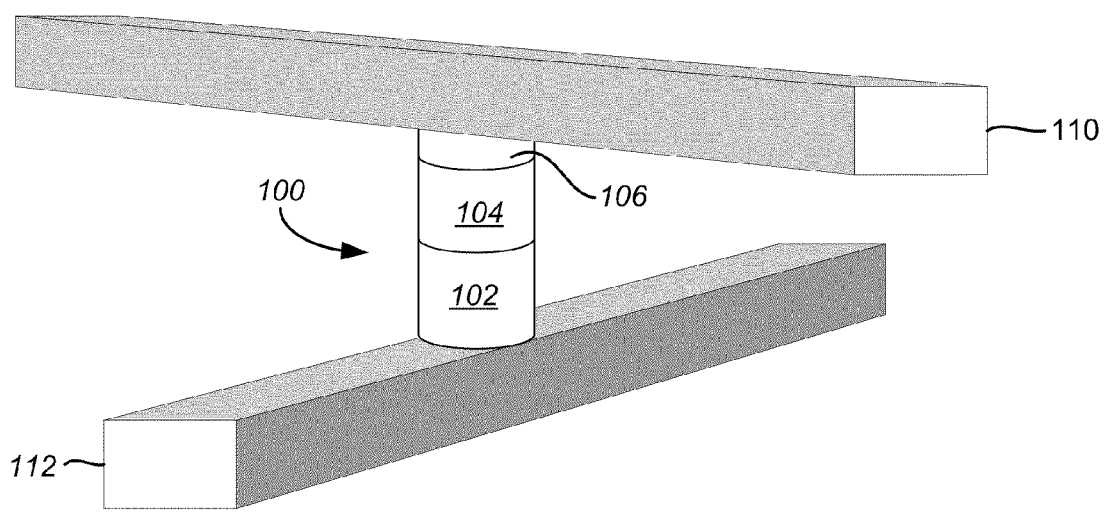
FIG. 1 depicts an exemplary non-volatile memory cell in accordance with one embodiment.

FIG. 1 depicts an exemplary structure for a non-volatile memory cell that can be used in accordance with embodiments of the present disclosure. A two-terminal memory cell 100 as depicted in FIG. 1 includes a first terminal portion connected to a first conductor 110 and a second terminal portion connected to a second conductor 112. The memory cell includes a steering element 102 in series with a state change element 104 and an anti-fuse 106 to provide non-volatile data storage. The steering element can take the form of any suitable device exhibiting a nonlinear conduction current characteristic such as a simple diode. Various embodiments of MIIM diodes disclosed herein can be used to implement the steering element. The state change element 104 will vary by embodiment and can include numerous types of materials to store data through representative physical states. State change element 104 can include resistance change materials, phase change resistive materials, etc. For example, a semiconductor or other material having at least two levels of detectable resistance change (e.g., low to high and high to low) is used in one embodiment to form a passive storage element 100.

Examples of suitable materials for state change element 104 include, but are not limited to doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be switched in a first direction (e.g., high to low), while in others, the resistivity may be switched from a first level (e.g., higher resistance) to a second level (e.g., lower resistance), and then switched back toward the first resistivity level.

In one embodiment, the state change element 104 is $Ge_2Sb_2Te_5$ (GST). GST has a property of reversible phase change from crystalline to amorphous-allowing two levels per cell. However, quasi-amorphous and quasi-crystalline phases may also be used to allow additional levels per cell with GST.

In some embodiments, the state change element 104 is formed from a carbon material. A state change element 104 that is formed from carbon may comprise any combination of amorphous and graphitic carbon. In one aspect, the carbon is deposited as a carbon film. However, it is not required that a carbon state change element be a carbon film. In one aspect, the state change element 104 is a carbon nanotube (CNT). There are numerous techniques to implement a switching mechanism in a CNT. One technique is to have an ion or nanoparticle of metal inside the CNT. The state of the element 104 is based on the position of the ion or nanoparticle within the CNT. However, other techniques can be used to store information in a CNT.

By assigning logical data values to the various levels of resistance that can be set and read from resistance change element 104, memory cell 100 can provide reliable data read/write capabilities. Anti-fuse 106 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states.

Anti-fuse 106 can provide benefits to memory cell 100 beyond its state change ability. For example, an anti-fuse can serve to set the on-resistance of the memory cell in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory cells to a lower resistance state or to reset memory cells to a higher resistance state. While specific examples may be provided with respect to set or reset operations, it will be appreciated that these are mere examples and that the disclosure is not so limited.

Various types of suitable state change elements are described in U.S. Pat. No. 6,034,882 entitled "Vertically Stacked Field Programmable Non-volatile Memory and Method of Fabrication." Various other types of state change elements may be used, including those described in U.S. Pat. No. 6,420,215 entitled "Three Dimensional Memory Array and Method of fabrication," and U.S. Pat. No. 6,631,085, entitled "Three-Dimensional Memory Array Incorporating Serial Chain Diode Stack," all hereby incorporated by reference in their entirety.

It will be appreciated that other types of two-terminal non-volatile memory cells can be used in embodiments. For example, one embodiment does not have an anti-fuse 106 and merely includes state change element 104 and steering element 102. Other embodiments may include additional state change elements in place of or in addition to the anti-fuse.

Conductors 110 and 112 are typically orthogonal to one another and form array terminal lines for accessing an array of memory cells 100. The array terminal lines (also called array lines) at one layer may be termed word lines or X-lines. The array lines at a vertically adjacent layer may be termed bit lines or Y-lines. A memory cell can be formed at the projected intersection of each word line and each bit line, and connected between the respective intersecting word line and bit line as shown for the formation of memory cell 100. A three-dimensional memory array which has at least two levels of memory cells (i.e., two memory planes) may utilize more than one layer of word lines and/or more than one layer of bit lines. A monolithic three dimensional memory array is one in which multiple memory levels are formed above a single substrate, such as a wafer, with no intervening substrates.

FIGS. 2A-2F depict several different embodiments of MIIM diodes, along with state change elements. The MIIM diodes may be used to implement the steering element 102 portion of the memory cell 100. The embodiment depicted in FIG. 2E also shows an anti-fuse 106. Note that the anti-fuse 106 is an optional element. Other elements such as bit line contacts and word line contacts are also shown in at least some of FIGS. 2A-2F.

Figure 2A:
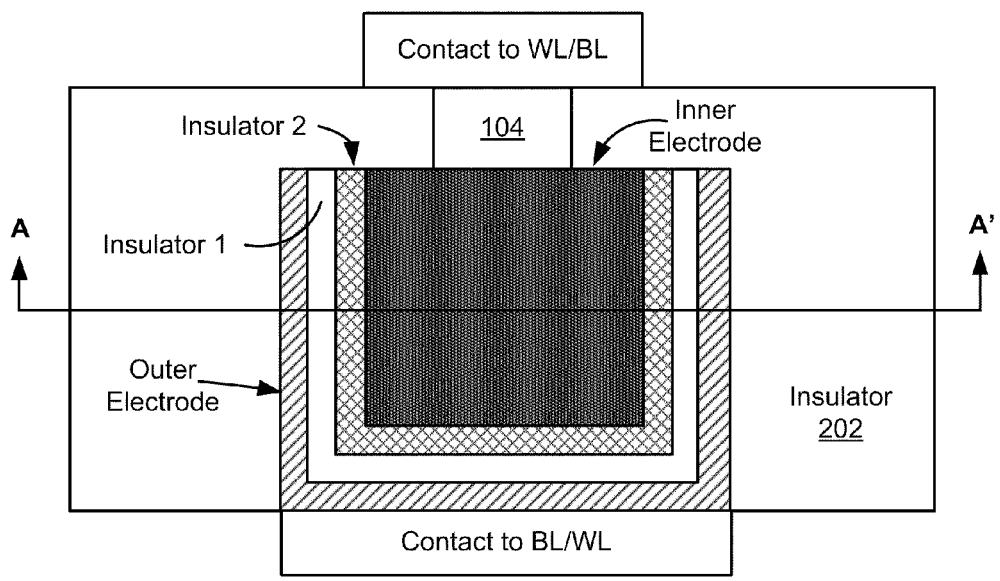
FIG. 2A, FIG. 2B, FIG. 2C, FIG. 2D, FIG. 2E, and FIG. 2F depict exemplary non-volatile memory cells in accordance with embodiments.
Figure 2B:
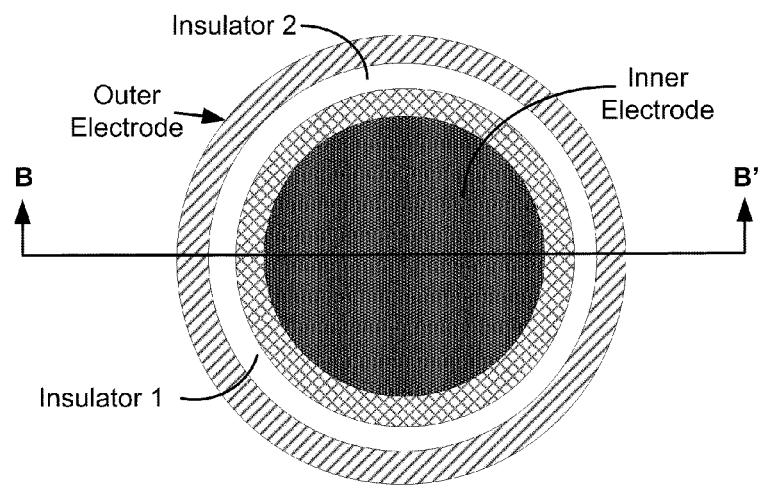

FIGS. 2A-2B depict a cross sectional view of one embodiment of a MIIM diode. FIG. 2A is a perspective taken along line B-B' of FIG. 2B. FIG. 2B is a perspective taken along line A-A' of FIG. 2A. The MIIM diode in general comprises an outer electrode, an inner electrode, with two insulators in between. FIG. 2A also depicts a state change element 104 in electrical contact with the inner electrode. This configuration with the inner electrode and outer electrode results in substantial surface area of the electrodes being near each other, considering the overall size of the MIIM diode. The large surface area results in a substantial diode on-current.

In the embodiment of FIG. 2B, the cross section of the MIIM diode is depicted as having a generally circular shape. However, the MIIM diode can have many other shapes along that cross section. For example, the cross section could be an ellipse or a polygon with any number of sides. If the cross section is a polygon it is not required that the corners be sharp. For example, the polygon could have rounded corners. The diode could have other shapes, such as a star shape. Thus, the cross section is not limited to a particular shape.

Figure 2C:
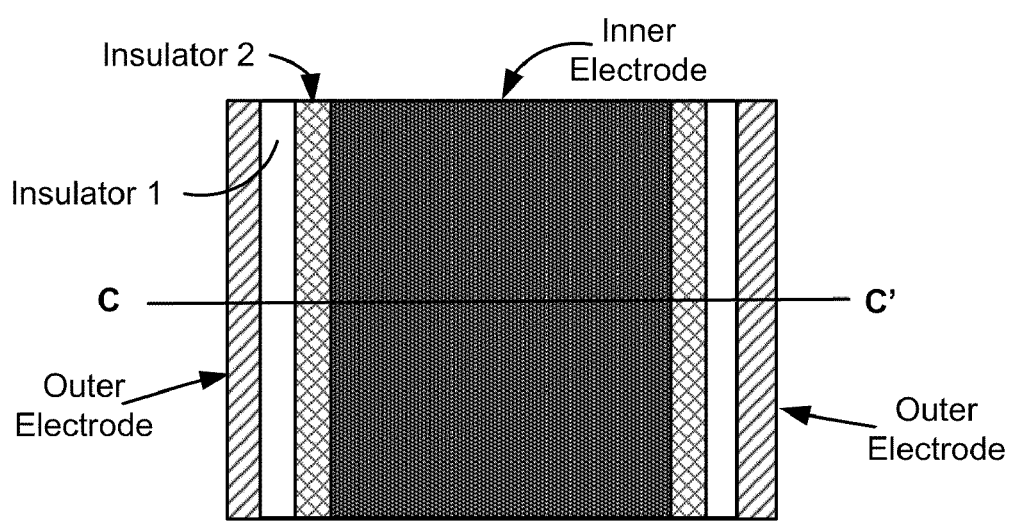

Further, while FIG. 2B depicts the outer electrode as completely surrounding the inner electrode (and insulators) with respect to the cross section shown in FIG. 2B, this is not a requirement. FIG. 2C shows an embodiment taken along the same cross section as FIG. 2B (line A-A' of FIG. 2A). Note that in FIG. 2C the outer electrode does not completely surround the inner electrode. Also note that the perspective taken along line C-C' of FIG. 2C may appear the same as the MIIM diode depicted in FIG. 2A.

In the embodiment depicted in FIGS. 2A-2B, the MIIM diode is disposed within a trench or via in an insulator 202. The trench is not explicitly shown in FIGS. 2A-2B. However, the outer electrode is formed in the trench. Therefore, the general shape of the trench can be understood as the outer bounds of the outer electrode, in this embodiment. In general, the trench has a bottom and one or more sidewalls. The bottom of the trench is the line that touches the bit line contact. As depicted in FIG. 2A, the sidewalls are vertical and are substantially perpendicular to the bottom. Thus, the outer electrode (and other elements) has substantially the same width from top to bottom in FIG. 2A. However, it is not required that the sidewalls of the trench be substantially perpendicular to the bottom of the trench. For example, the sidewalls could be wider near the top than near the bottom. Thus, the width of the outer electrode (and other elements) could become progressively wider nearer the top.

Figure 2D:
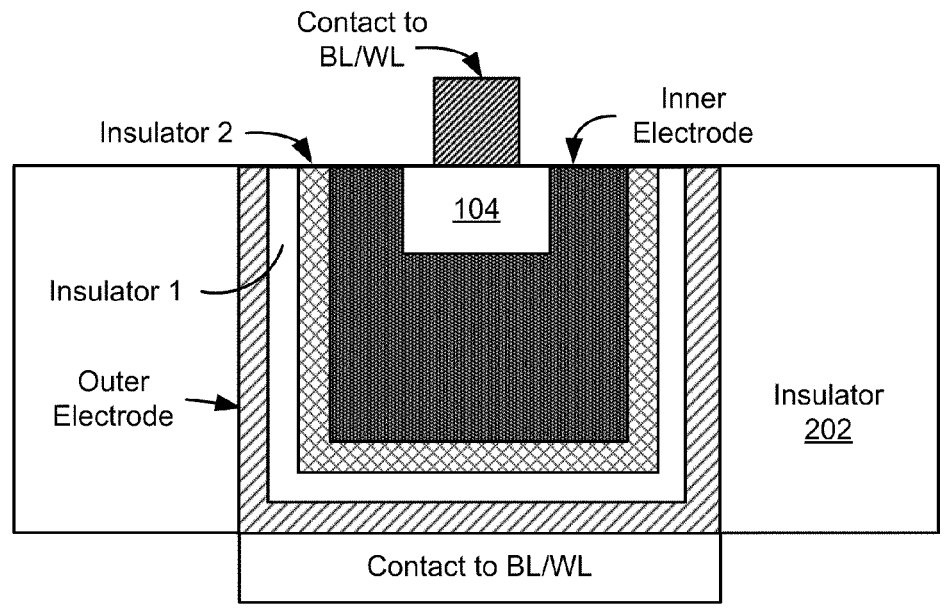
Figure 2E:
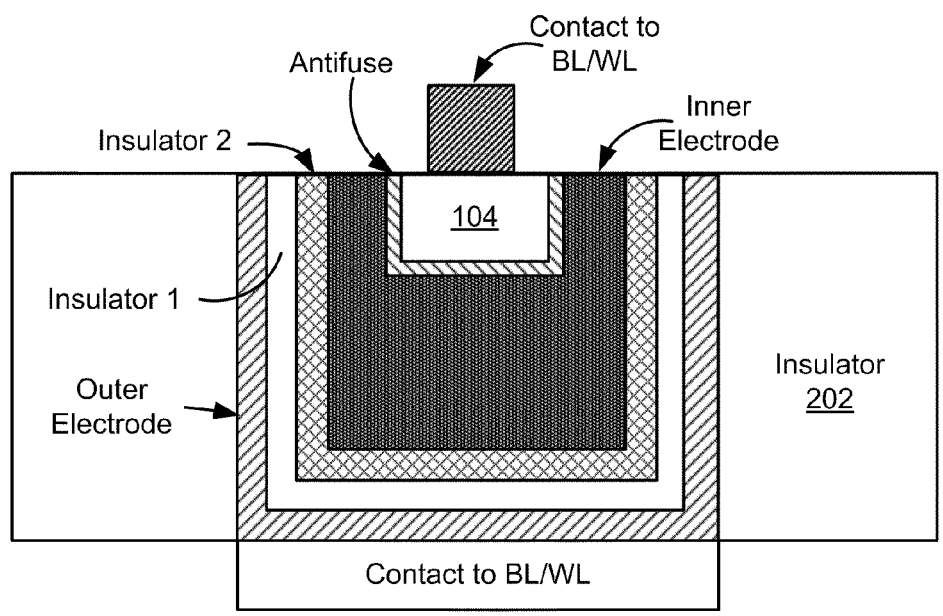

FIG. 2D depicts one embodiment of a MIIM diode in which a state change element 104 is disposed within a recess in the inner electrode. FIG. 2E depicts one embodiment of a MIIM diode in which a state change element 104 and an anti-fuse are disposed within a recess in the inner electrode. Both FIGS. 2D and 2E are depicted from the same orientation as FIG. 2A. In the embodiments of 2D and 2E both the state change element 104 and the anti-fuse may have a variety of shapes when viewed from the top (e.g., from a perspective such as depicted in FIG. 2B). Examples of such alternative shapes have already been discussed with respect to the embodiment of FIG. 2B.

Figure 2F:
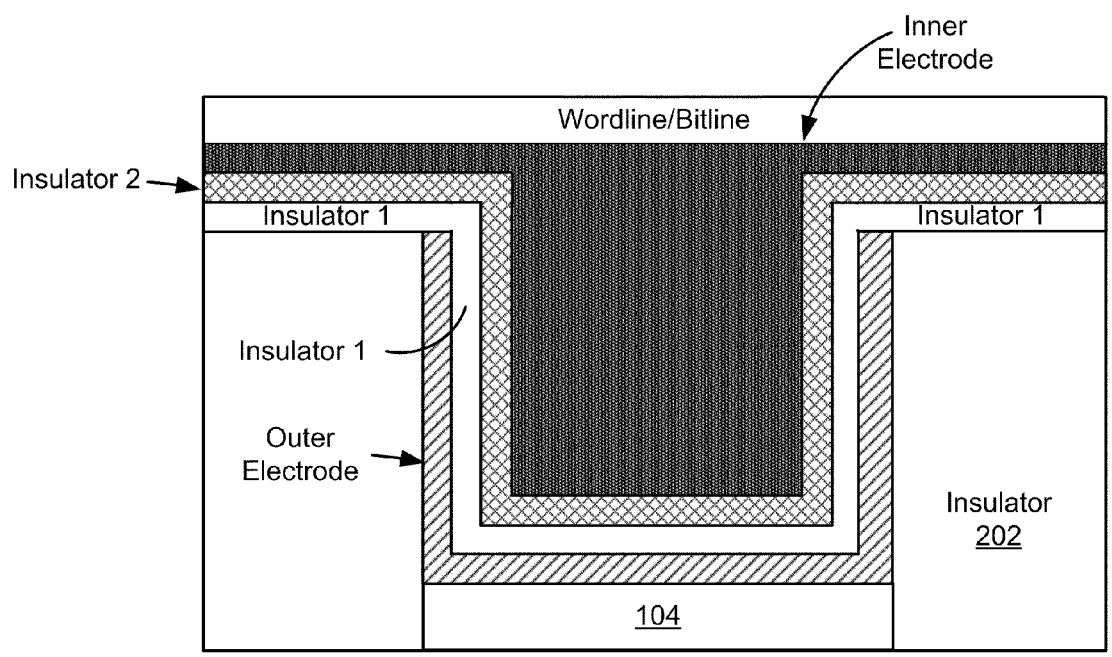

FIG. 2F depicts one embodiment of a MIIM diode in which the insulators and the inner electrode each have a portion that extends over a surface of the insulator 202. Also, in this embodiment the state change element 104 is located below the inner electrode. FIG. 2F is depicted from the same orientation as FIG. 2A.

In the embodiment depicted in FIG. 2F, the state change element 104 is at the bottom of the trench. The inner electrode is disposed over the state change element 104. Thus, the inner electrode is over the bottom of the trench—in other words, being over does not mean being in direct contact with. The inner electrode is also disposed adjacent to the sidewalls of the trench. Note that a layer of another material (e.g., an adhesion layer) may reside between the inner electrode and the sidewall. The first insulator has a first portion that is disposed over the inner electrode (the portion within the trench). The first insulator has one or more portions that extend over the surface of the insulator 202. It is not required that the first insulator be in physical contact with the surface of the insulator 202, although that is one possibility. It is also possible for one or more layers of other material to be present between the first insulator and the surface of the insulator 202.

The second insulator has a first portion that is disposed over the first insulator (the portion within the trench). The second insulator has one or more portions that extend over the first insulator. In another embodiment, the first insulator does not extend over the insulator 202 surface. In this latter embodiment, the second insulator may or may not be in direct contact with the insulator 202 surface (i.e., a material other than the first insulator may be over the insulator 202 surface).

The inner electrode has a first portion that is disposed within the trench and one or more portions that extend over the second insulator. In another embodiment, neither the first insulator nor the second insulator extend over the insulator 202 surface. In this latter embodiment, the inner electrode may or may not be in direct contact with the insulator 202 surface (i.e., a material other than an insulator may be over the insulator 202 surface).

The embodiment of FIG. 2F also has a wordline/bitline over the inner electrode. The wordline/bitline refers to a conductor that may function as either a word line or as a bit line depending on how the memory cell is being used in the memory array.

Note that additional layers of materials may be present in any of FIGS. 2A-2F. For example, in some embodiments, a layer of material may be added between two layers depicted in FIG. 2A-2F to improve adhesion. As an example, a material such as TaN can be added.

Figure 3A:
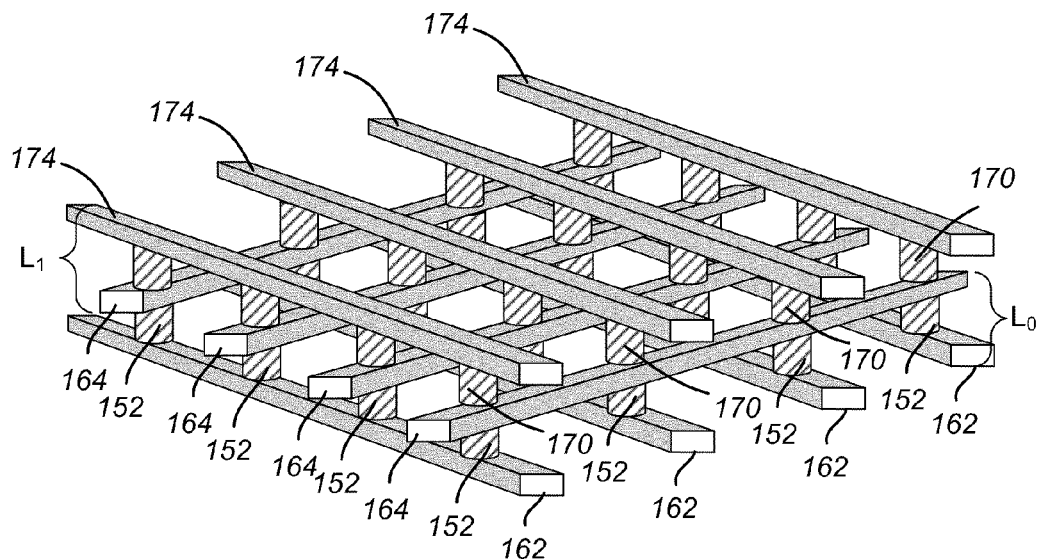
FIGS. 3A and 3B are respective perspective and cross-sectional views of a three-dimensional memory array in accordance with one embodiment.
Figure 3B:
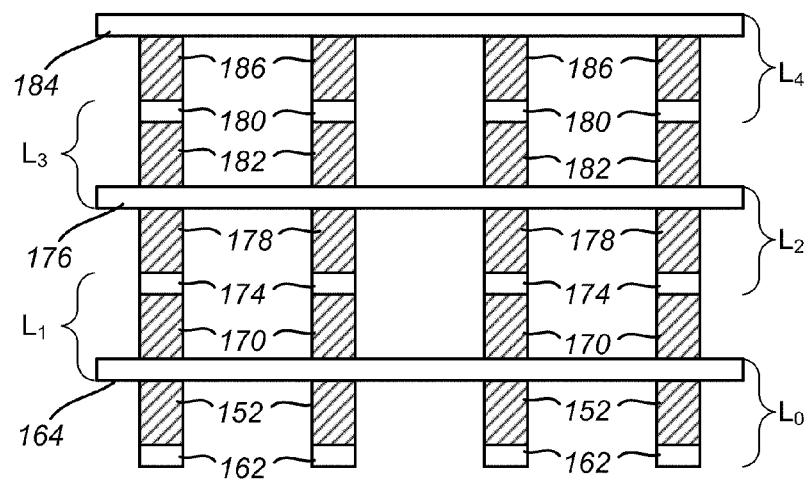

FIGS. 3A-3B depict a portion of an exemplary monolithic three-dimensional memory array that can be used in various embodiments. However, other memory structures can be used in accordance with various embodiments, including two-dimensional memory structures manufactured on, above, or within a semiconductor substrate. Both the word line and bit line layers are shared between memory cells in the structure depicted in the perspective view of FIG. 3A. This configuration is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 3A-3B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 3B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or fewer than five memory levels can be used.

In one embodiment, the MIIM diodes of memory cells 170 are formed upside down relative to the MIIM diodes of the first level of memory cells 152. For example, referring to the inner and outer electrodes in FIG. 2A, the inner electrode may be closest to conductor 164 for cells 170, whereas the outer electrode may be closest to conductor 164 for cells 152.

In an alternative embodiment, an inter-level dielectric can be formed between adjacent memory levels. In this alternative, no conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines are shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

In one embodiment, word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address. An example of such a configuration is described in U.S. Pat. No. 7,054,219, entitled, "Transistor Layout Configuration for Tight Pitched Memory Array Lines", which is hereby incorporated by reference in its entirety.

Figure 4:
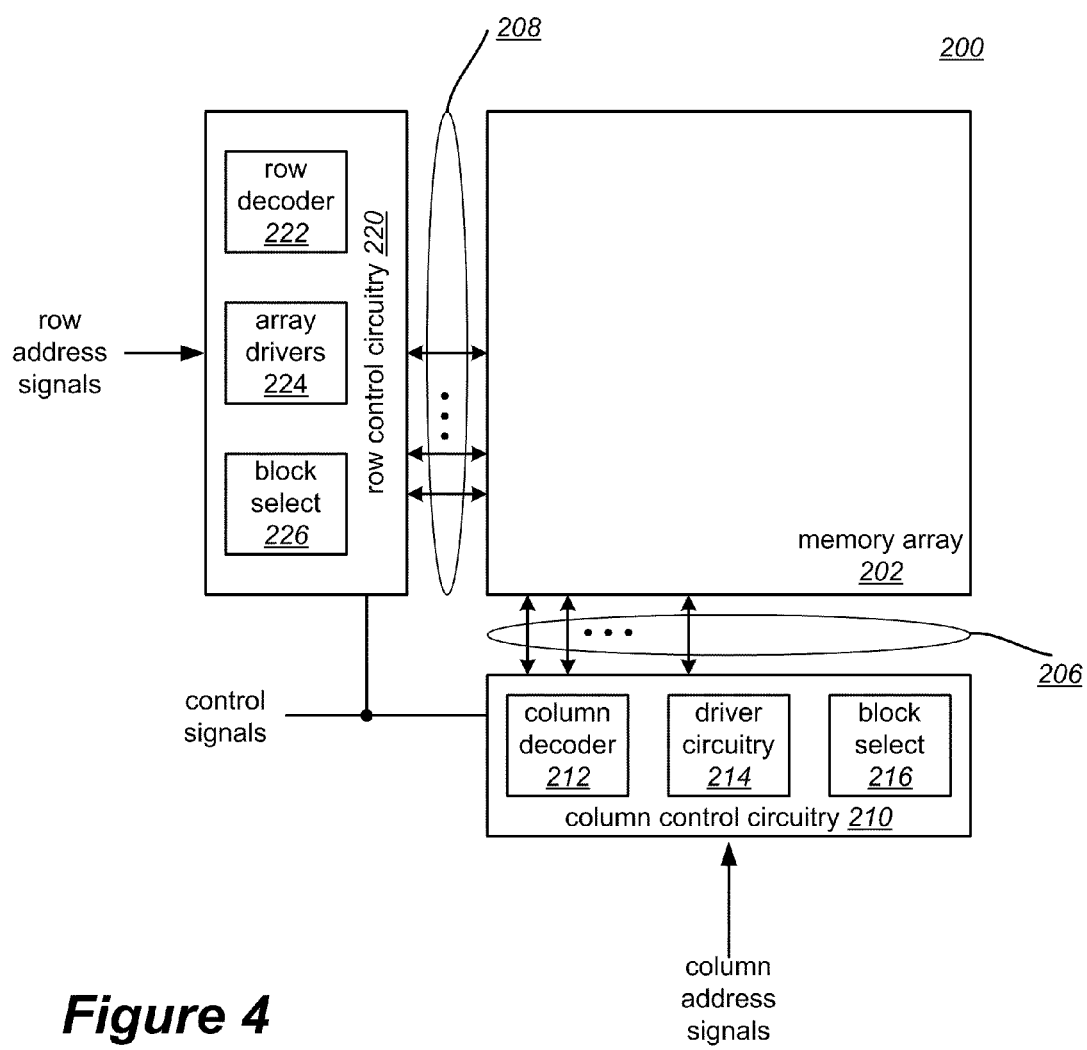
FIG. 4 is block diagram of a non-volatile memory system in accordance with one embodiment.

FIG. 4 is a block diagram of an integrated circuit including a memory array 202. The array terminal lines of memory array 202 include the various layer(s) of word lines organized as rows, and the various layer(s) of bit lines organized as columns. The integrated circuit 200 includes row control circuitry 220 whose outputs 208 are connected to respective word lines of the memory array 202. The row control circuitry receives a group of M row address signals and one or more various control signals, and typically may include such circuits as row decoders 222, array terminal drivers 224, and block select circuitry 226 for both read and write (i.e., programming) operations. The integrated circuit 200 also includes column control circuitry 210 whose input/outputs 206 are connected to respective bit lines of the memory array 202. The column control circuitry 206 receives a group of N column address signals and one or more various control signals, and typically may include such circuits as column decoders 212, array terminal receivers or drivers 214, block select circuitry 216, as well as read/write circuitry, and I/O multiplexers. Circuits such as the row control circuitry 220 and the column control circuitry 210 may be collectively termed control circuitry or array terminal circuits for their connection to the various array terminals of the memory array 202.

Integrated circuits incorporating a memory array usually subdivide the array into a sometimes large number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Figure 5:
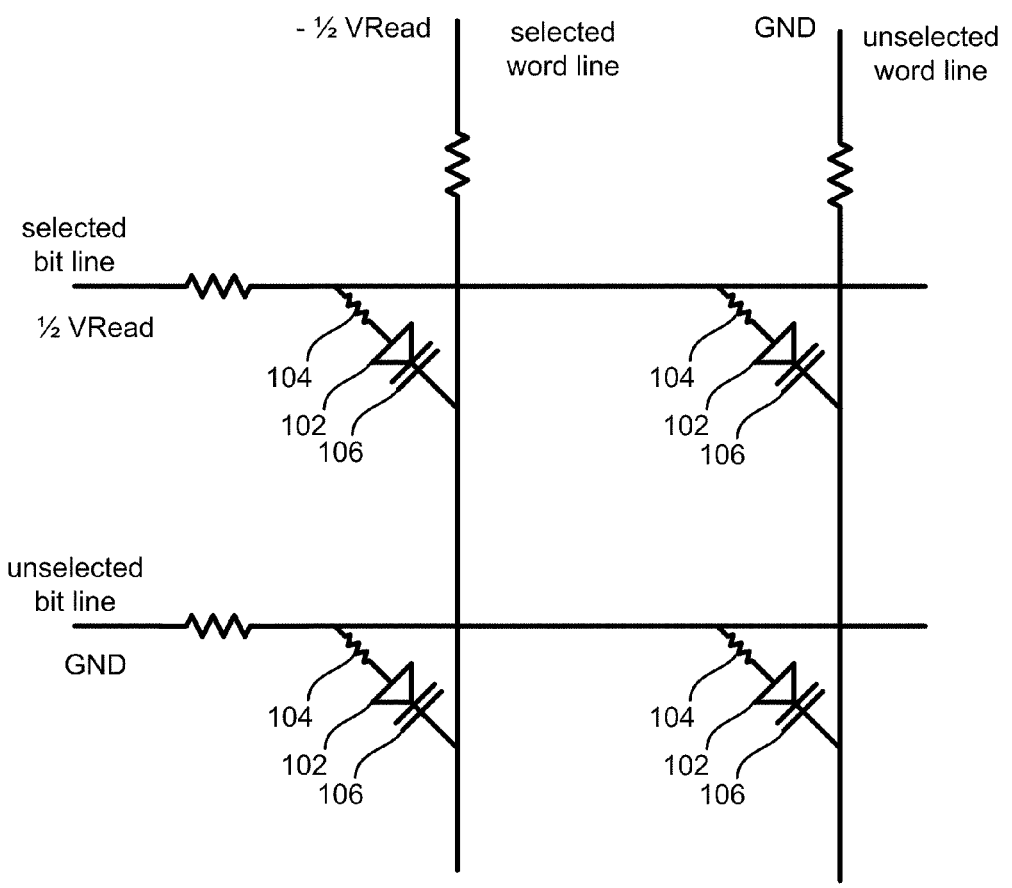
FIG. 5 is a simplified circuit diagram of a memory array in accordance with one embodiment.

FIG. 5 is a circuit diagram of a portion of a memory array during operation in accordance with one embodiment. Various biasing schemes can be used to program and read the memory cells. The following describes details of some implementations, but it not intended to be limiting. In some implementations, memory cells are programmed or read by establishing an appropriate voltage across the memory element by application of suitable voltages to the word lines and bit lines.

For example, to read a memory cell, selected bit lines may be set to a positive bias (e.g., ½ Vread) with unselected bit lines grounded. Selected word lines may be set to at a negative bias (e.g., −½ Vread) with unselected word lines grounded. Thus, a selected memory cell will have Vread across it. Other bias conditions may also be used to read the memory cells.

In some embodiments, the state change element is formed from carbon. In these embodiments, memory cell operation may be based on a bi-stable resistance change in the carbon material with the application of high bias voltage (e.g., 4 V). The difference in resistivities between the two states may be over 100×, as described in U.S. Pat. No. 6,706,402. Current through the memory cell is a function of the resistance of the carbon material. The memory cells are read at a lower voltage than the program voltage such that reading will not change the resistance of the carbon material. The memory cell may be changed from a "0" to a "1" with the application of high forward bias on the diode. The memory cell may be changed back from a "1" to a "0" with the application of a high forward bias.

The details of operating the memory cells will vary depending on the embodiment. The following describes other details of operating some embodiments of memory cells. During integrated circuit manufacturing, the state change element of the memory cell may be placed in a certain one of its possible states; this is called the "initial state." For example, if the state change element is a dielectric-rupture anti-fuse having the two states (ruptured dielectric) and (intact dielectric), the initial state of this element is (intact) after manufacturing and before programming. Other embodiments of state change elements will have different sets of states and thus different initial states. By convention this initial state, the "logic zero" state denotes the initial value stored in the memory cell during semiconductor manufacturing. But of course other conventions, calling the initial state e.g. "logic one," would be equally valid, and the choice is merely a matter of preference or convenience rather than technological necessity.

The memory cell is programmed by causing the state change element to transition from its initial state into a new state. Many embodiments of the state change element can be caused to change state by applying a suitably large voltage across the memory cell, from input terminal to output terminal. For example, if the state change element is embodied as a dielectric-rupture antifuse, it may be programmed by applying a large voltage across the cell's terminals (or by forcing a large current through the cell), with the polarity chosen such that the steering element is forward biased. This places a large electric field directly across the dielectric antifuse, which ruptures the dielectric, thus changing the state of the state change element.

One possible method for programming a dielectric-rupture state change element is to ground the memory cell's output terminal and simultaneously raise its input terminal to a large positive voltage (assuming the steering element is so oriented that its anode faces the input terminal and its cathode faces the output terminal, i.e., steering element is forward biased when the input terminal is at a higher voltage than the output terminal). If the steering element is oriented the other way, with anode facing the output terminal and cathode facing the input terminal, the designer can simply reverse the programming voltages and keep the steering element forward biased during programming: ground the input terminal and simultaneously raise the output terminal to a large positive voltage. Many other voltage arrangements for forward biasing the steering element and programming a dielectric-rupture state change element will be readily apparent to those skilled in the art.

Other embodiments of the state change element can be caused to change state by forcing a suitably large current through the memory cell, rather than forcing a large voltage across the memory cell. For example, if the state change element is embodied as a polysilicon-resistor fuse, it may be programmed by connecting a current source to its input terminal and simultaneously grounding its output terminal (assuming this polarity forward biases the steering element). Assuming the current is large enough, it alters the resistance of the polysilicon-resistor fuse, thus changing the state of the state change element and programming the cell.

During programming, it is possible for nonselected memory cells to be reverse-biased by the full programming voltage. Accidental writes of nonselected memory cells might occur, if the reverse leakage current of the steering element exceeded the programming current necessary to change the state of the state change element. Thus, the characteristics of the steering and state change elements should be matched to one another; a state change element that requires a large current to program (e.g., an intrinsic poly fuse) can be used with a rather high-leakage steering element, while a state change element that programs at very low current (e.g., a dielectric rupture antifuse) requires a low-leakage steering element.

The memory cell can be embodied either as a one-time programmable nonvolatile memory, or as a write/erase/rewrite nonvolatile memory, depending on the state change element selected. In a first example, if a thin, highly resistive, polycrystalline silicon film antifuse is employed as the state change element (as taught in U.S. Pat. No. 4,146,902), its programming operation is irreversible and the cell is one-time programmable. After manufacturing and before programming, all cells contain "logic zero". Those cells whose desired contents are "logic one" are programmed, irreversibly, by forcing the state change element into a new state. Logic zeroes may become logic ones (by programming), but logic ones may NOT become logic zeroes (since programming is irreversible in this type of state change element).

In a second example, if a metal-via-insulator-silicon filament fuse is employed as the state change element (as taught in U.S. Pat. No. 3,717,852), its programming operation is reversible and the cell may be written, erased, and rewritten. After manufacturing and before programming, all cells contain "logic zero". Those cells whose desired contents are "logic one" are programmed. However, for this state change element, programming is reversible and logic values may be changed from zero to one and back from one to zero, if desired.

In a third example, a state change element having a write/erase/rewrite capability may be employed, whose programming operation is electrical but whose erase operation is not necessarily electrical. The erase operation may be selectively applied to a single memory cell, or it may be applied to all memory cells at once, "in bulk," such as by exposing them to a strong source of ultraviolet light as is done with UVEPROM memories. Or a bulk erase operation may be initiated by heating the integrated circuit, either from a heat source external to the IC or from a heater directly on the IC. Or a bulk erase might be initiated by placing the state change elements in a strong magnetic field.

While the above discussion is based on a state change element that has two states, this is not necessary. An antifuse that can provide a predetermined range of resistance where for instance it is partly fused, would provide a three state element. A floating gate MOS device allows numerous possible implementations of multi-level storage, providing more than 2 states for a state change element, as is well known in the art.

Figure 6:
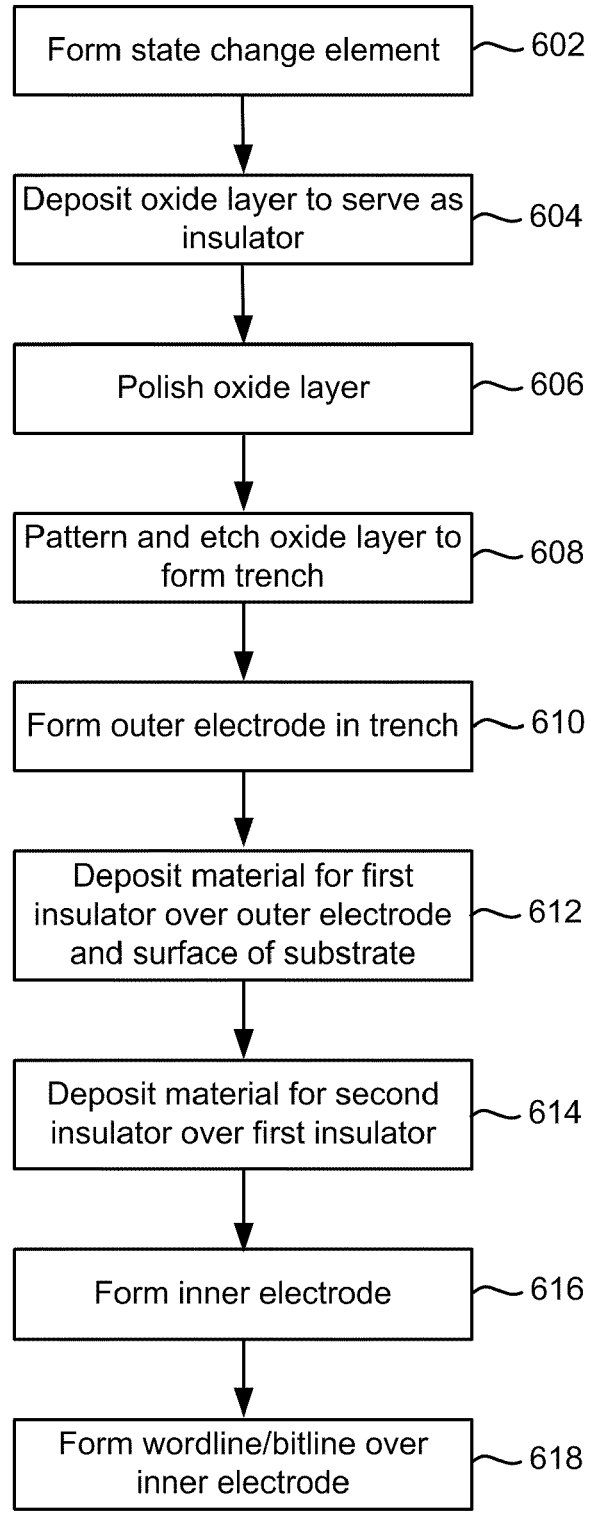
FIG. 6 is a flowchart illustrating steps of one embodiment of a process of fabricating a non-volatile memory cell.

FIG. 6 is a flowchart of one embodiment of a process for forming a MIIM diode. The process describes one technique for forming the MIIM diode depicted in FIG. 2F. FIG. 7A-FIG. 7E are diagrams illustrating various stages of formation of the embodiment of the MIIM diode depicted in FIG. 2F, and will be referred to when discussing the process of FIG. 6. The process may be performed as a part of forming a memory array such as those depicted in FIGS. 3A and 3B. Note that this process might be used when forming a first layer of the memory array or after forming lower layers of the memory array.

In step 602, a state change element 104 is formed. Many different types of state change elements can be formed in this step. As one example, a GST state change element is formed. In one aspect, the GST state change element is set to either a crystalline (conductive) state or an amorphous (high resistance) state in step 602. The state of the GST state change element is controlled by heating to an appropriate temperature for an appropriate time. The heating can be achieved by passing a current through the GST state change element. For example, a GST state change element may be transformed into an amorphous (high resistance) state by heating the GST state change element to a melting temperature, and then fast quenching the phase-change material GST. Rapid cooling of the material to below its glass transition temperature causes the GST state change element to be locked into its amorphous phase. During operation of the memory device, in order to switch the GST state change element back to its conductive state, the GST state change element may be heated to at least its crystallization temperature (which is between the glass transition temperature and the melting temperature). This heating causes nucleation and crystal growth to rapidly occur over a period of several nanoseconds. The crystallization temperature is maintained for a period of time that is sufficient to allow the formation of crystals in the GST state change element.

Note that many other types of state change elements 104 could be formed in step 602. Examples of other state change elements 104 have already been provided herein. Step 602 may form any of those example state change elements, or other state change elements 104 not specifically mentioned herein.

In step 604, an oxide layer is deposited above and around the state change element 104. The oxide layer will serve as insulator 202. In step 606, the oxide layer is polished to smooth the surface of the oxide. For example, chemical mechanical polishing (CMP) is performed.

Figure 7A:
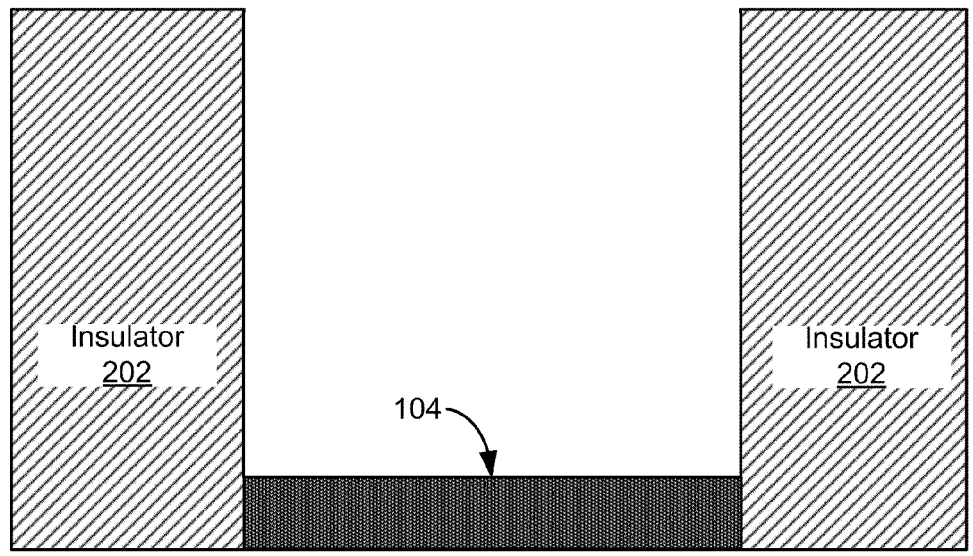
FIG. 7A, FIG. 7B, FIG. 7C, FIG. 7D, and FIG. 7E depict various stages of fabrication of a non-volatile memory cell in accordance with one embodiment.

In step 608, the oxide layer is patterned and etched to form a trench in the oxide layer. The etch may be isotropic or anisotropic. Etches that are more isotropic could help reduce the burden on the lithography while contacting the inner electrode and also make the device more scalable. An example width for the trench is 22 nanometers. An example depth for the trench is 70 nanometers. However, the trench could have a different width and/or a different depth. Also, note that the aspect ratio of the trench could be higher or lower than this example. Results of steps 602-608 are depicted in FIG. 7A. FIG. 7A depicts the trench as having a substantially uniform width from top to bottom. However, the trench could have a non-uniform width. As one example, the trench could become progressively narrower towards the bottom.

Figure 7B:
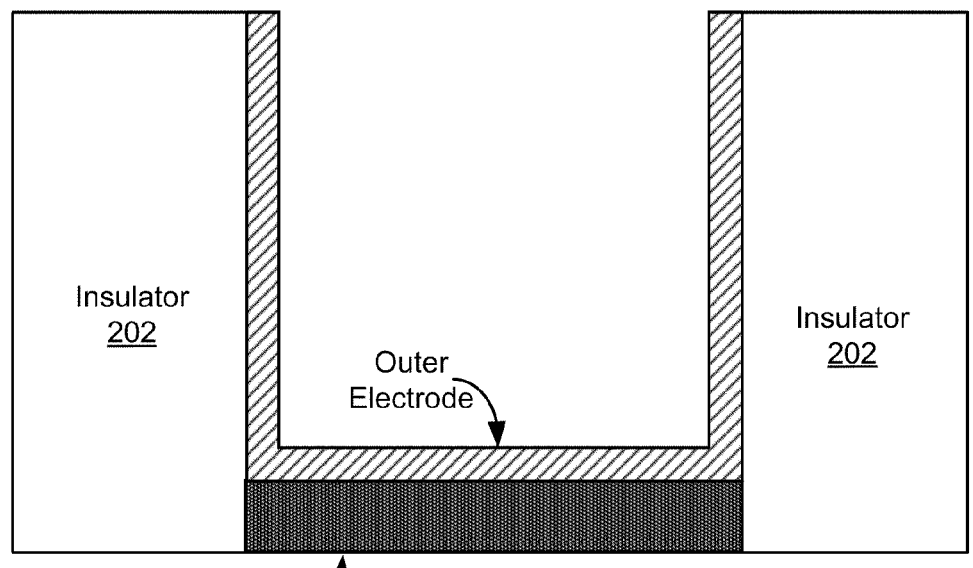

In step 610, an outer electrode is formed in the trench. In one aspect, the outer electrode is formed using atomic layer deposition (ALD). However, other techniques can be used to form the outer electrode. After depositing the material for the outer electrode, excess material that is outside of the trench is removed. Thus, diodes in different trenches are electrically isolated. In one implementation, polishing (e.g., CMP) is performed to result in the electrode material covering only the bottom and sidewalls of the trench. The outer electrode does not cover the top surface of the insulator 202 after CMP. In another implementation, excess electrode material is removed by etching. FIG. 7B depicts the results after step 610. The outer electrode has an outer surface (in contact with insulator 202 and state change element 104) and an inner surface. The inner surface defines a region within the outer electrode.

In one implementation, the outer electrode is formed from titanium nitride (TiN). In one implementation, the work function of the outer electrode is tuned by addition of a suitable material. For example, aluminum is added to tune the work function. If the outer electrode is to serve as the cathode of the diode, the work function could be established at 4 eV, as an example. If the outer electrode is to serve as the anode, the work function could be established at 5 eV, as an example. Note that in this example, the cathode is established with a lower work function than the anode. Other values that 4 eV and 5 eV could also be used. It is not a requirement that the cathode have a lower work function than the anode. In another aspect, the anode and cathode have the same work function. In still another aspect, the cathode has a higher work function than the anode.

It is not required that the outer electrode be formed from TiN. In one implementation, a diode is formed in which the outer electrode is formed from polysilicon that has been treated to increase its conductivity. As an example, the outer electrode is formed from doped polysilicon. For example, the outer electrode could be n+ doped polysilicon or p+ doped polysilicon. The polysilicon can be treated in other ways to increase its conductivity. Herein, the term metal insulator diode is intended to include diodes whose electrodes are formed from polysilicon.

Figure 7C:
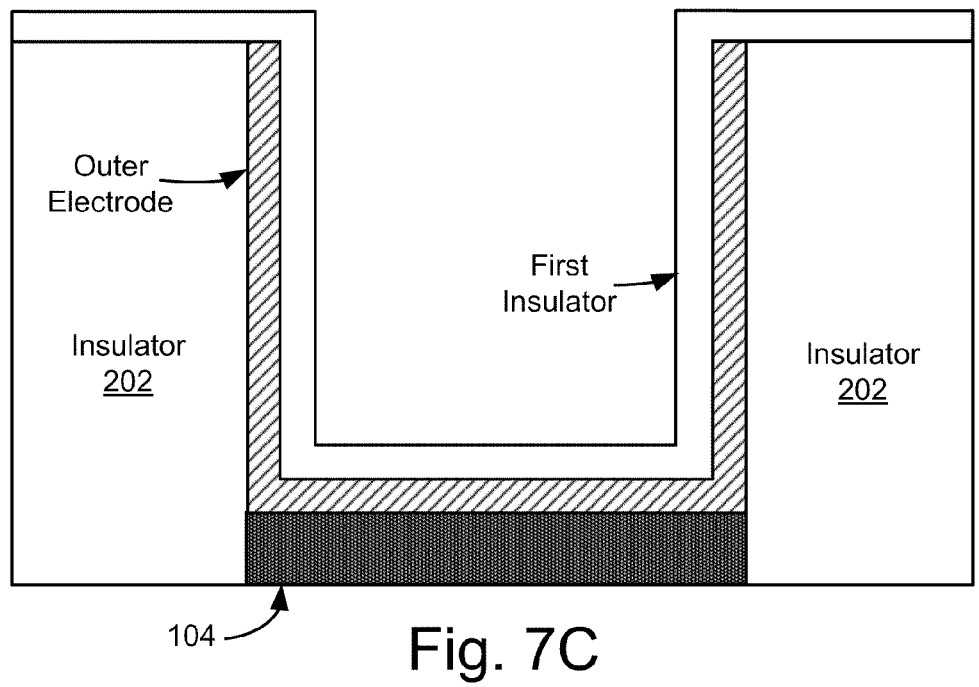

In step 612, a first insulator layer is formed. A portion of the first insulator is deposited as a conformal layer over the inner surface of the outer electrode. Another portion of the first insulator is deposited over the surface of the insulator 202. In one aspect, the first insulator is formed using atomic layer deposition (ALD). However, other techniques can be used to form the first insulator. The first insulator may be formed from silicon dioxide. As an example, the first insulator can be about 10 Angstroms thick. The first insulator may have roughly the same thickness on the bottom of the trench as on the sides. It is not a requirement that the first insulator have a uniform thickness, although the first insulator should be continuous. FIG. 7C depicts the results after step 612.

Figure 7D:
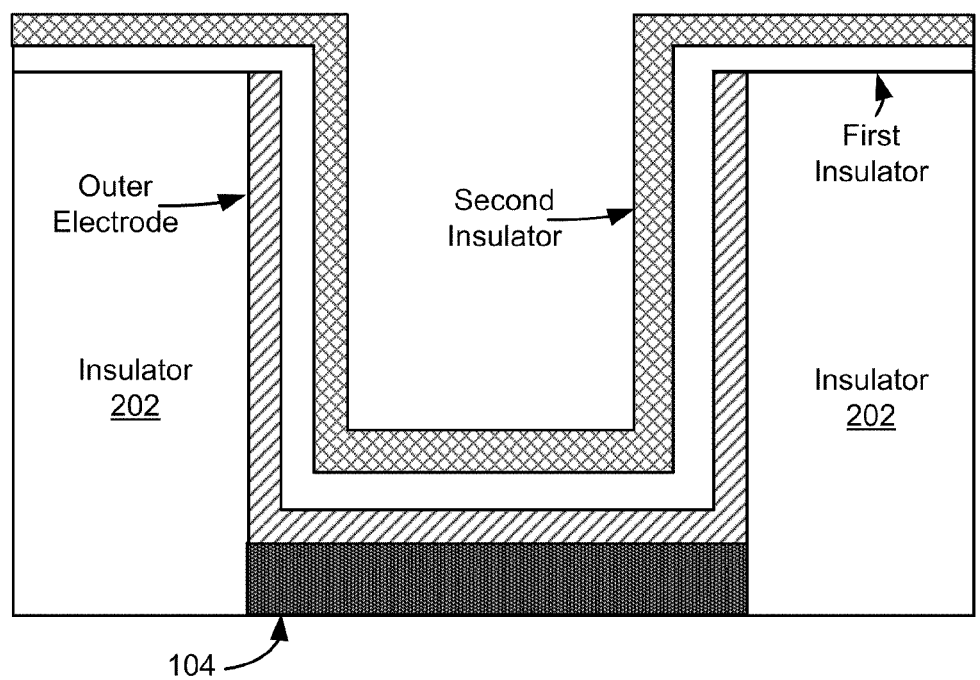

In step 614, a second insulator layer is formed. A portion of the second insulator is deposited as a conformal layer over the portion of the first insulator that is within the trench. Another portion of the second insulator is deposited over the portion of the first insulator that extends over the insulator 202 surface. In one aspect, the second insulator is formed using atomic layer deposition (ALD). However, other techniques can be used to form the second insulator. The second insulator may be formed from hafnium dioxide ($HfO_2$). As an example, the second insulator can be about 20 Angstroms thick. The second insulator may have roughly the same thickness on the bottom of the trench as on the sides. It is not a requirement that the second insulator have a uniform thickness, although the second insulator should be continuous. FIG. 7D depicts the results after step 614.

In step 616, the inner electrode is formed. A portion of the inner electrode is formed within the trench. Another portion of the inner electrode is formed over the portion of the second insulator that extends over the insulator 202 surface. The inner electrode may be formed from TiN. However, other materials can be used to form the inner electrode. The material for the inner electrode may be depositing using many different techniques. In one aspect, the inner electrode is formed using atomic layer deposition (ALD). However, it is not required that the inner electrode be deposited as a very thin layer, hence ALD is not required for forming the inner electrode. After depositing the material, polishing (e.g., CMP) is performed.

Figure 7E:
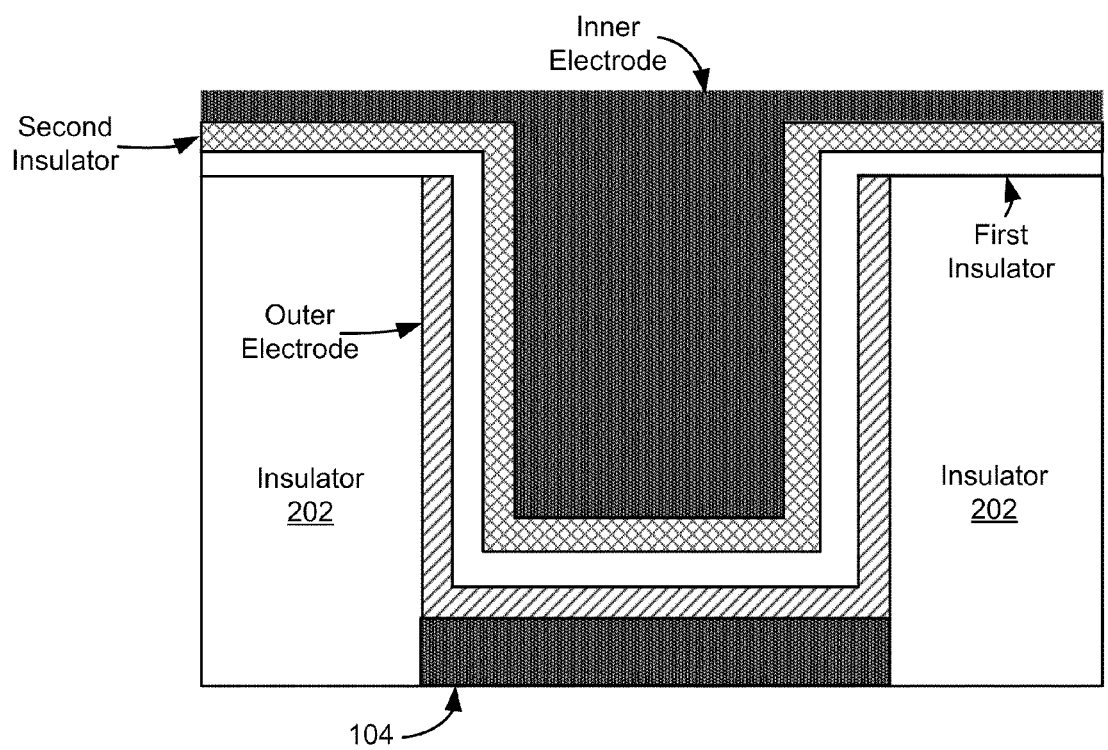

In one aspect, the inner electrode serves as the anode and has work function of 5 eV with the outer electrode serving as the cathode with a work function of 4 eV. In another aspect, the inner electrode serves as the cathode and has work function of 4 eV with the outer electrode serving as the anode with a work function of 5 eV. FIG. 7E depicts the results after step 616.

In step 618, a wordline/bitline is formed over top of the inner electrode. The wordline/bitline may be formed from Aluminum, although other materials could be used. Step 618 includes depositing the material for the wordline/bitline, patterning, and etching. Techniques for patterning and etching wordlines/bitlines are well known and will not be discussed in detail. The result after performing step 618 is depicted in FIG. 2F.

Figure 8:
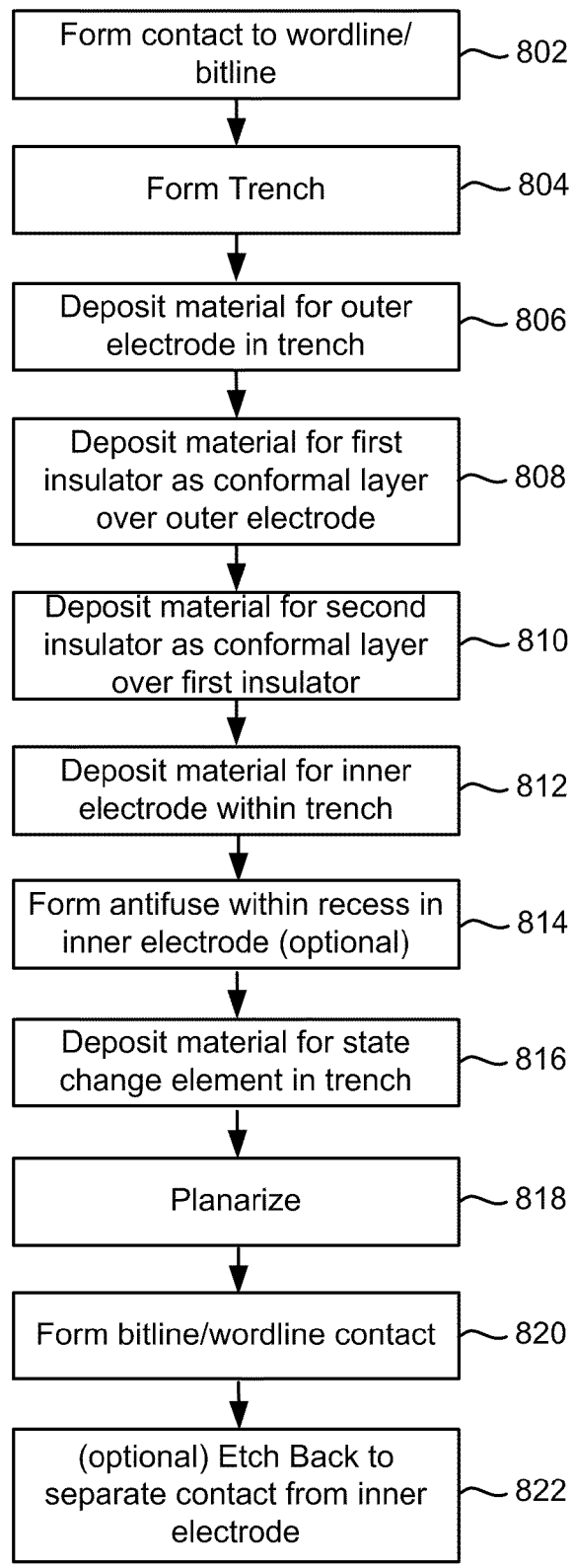
FIG. 8 is a flowchart illustrating steps of one embodiment of a process of fabricating a non-volatile memory cell.

FIG. 8 is a flowchart of one embodiment of a process for forming a MIIM diode. The process describes one technique for forming the MIIM diode depicted in FIG. 9E. In step 802, a wordline/bitline contact is formed. In one implementation, the wordline/bitline contact is formed from TiN; however, another material could be used. The word line or bit line itself may be formed from aluminum, tungsten, or another conductive material. The formation of the wordline/bitline contact can be achieved by depositing TiN and patterning and etching.

In step 804, a trench or via is formed. In one embodiment, the trench is formed by depositing, patterning, and etching an insulator. For example, an insulating material such as $SiO_2$, $Si_3N$ is deposited above the bit line (or word line) and wordline/bitline contact. The insulating material will serve as the insulator 202. The insulating material is planarized to smooth the surface of the oxide. For example, chemical mechanical polishing (CMP) is performed. The planarized insulating material is patterned and etched to form a trench in the oxide layer. The etch may be isotropic or anisotropic. An example width for the trench is 22 nanometers. An example depth for the trench is 70 nanometers. However, the trench could have a different width and/or a different depth. Also, note that the aspect ratio of the trench could be higher or lower than this example.

In one embodiment, the trench is not formed by depositing, patterning, and etching oxide. Instead, pillars are formed. Then, oxide (or another insulator) is formed around the pillars. Next, the pillars are removed to create the trenches where the pillars were located. For example, germanium pillars are formed on top of the bitline/wordline contacts. The germanium is deposited, patterned and etched into pillars that reside in regions in which the trenches or vias are to be formed. The pillars can be formed from a material other than germanium. An insulating material such as $SiO_2$, $Si_3N$ is deposited around the pillars. The insulating material will serve as the insulator 202. The insulating material is planarized by an etch back process, chemical mechanical polishing (CMP) or the like. After planarization, the pillars may be removed with ashing or other etching technique to generate the trenches in the insulator 202.

In step 806, material for an outer electrode is deposited. In one aspect, the outer electrode is formed using atomic layer deposition (ALD). However, other techniques can be used to form the outer electrode. The depositing may leave some electrode material over the surface of the insulator 202. This electrode material may be removed in a later processing step. Thus, when processing is complete the outer electrode covers the bottom and sidewalls of the trench, but does not cover the top surface of the insulator 202. In one implementation, the outer electrode is formed from TiN. In one implementation, the work function of the outer electrode is tuned by addition of a suitable material. For example, aluminum is added to tune the work function. If the outer electrode is to serve as the cathode of the diode, the work function could be established at 4 eV, as an example. If the outer electrode is to serve as the anode, the work function could be established at 5 eV, as an example. Note that in this example, the cathode is established with a lower work function than the anode. Other values that 4 eV and 5 eV could also be used. It is not a requirement that the cathode have a lower work function than the anode. In another aspect, the anode and cathode have the same work function. In still another aspect, the cathode has a higher work function than the anode.

It is not required that the outer electrode be formed from TiN. In one implementation, a diode is formed in which the outer electrode is formed from polysilicon that has been treated to increase its conductivity. As an example, the outer electrode is formed from doped polysilicon. For example, the outer electrode could be n+ doped polysilicon or p+ doped polysilicon. The polysilicon can be treated in other ways to increase its conductivity.

In step 808, material for a first insulator layer is deposited in the trench. In one aspect, the first insulator is formed using atomic layer deposition (ALD). However, other techniques can be used to form the first insulator. The first insulator may be formed from silicon dioxide. As an example, the first insulator can be about 10 Angstroms thick. The first insulator may have roughly the same thickness on the bottom of the trench as on the sides. It is not a requirement that the first insulator have a uniform thickness, although the first insulator should be continuous. In this embodiment, when processing is complete first insulator lies entirely within the trench. However, at this point some of the insulator material may still reside over the surface of the insulator 202.

In step 810, material for a second insulator layer is deposited in the trench. Some of the material may extend over the surface of the insulator 202. In this embodiment, the second insulator lies entirely within the trench when processing is complete. However, the excess material may be removed in a later processing step. In one aspect, the second insulator is formed using atomic layer deposition (ALD). However, other techniques can be used to form the second insulator. The second insulator may be formed from $HfO_2$. As an example, the second insulator can be about 20 Angstroms thick. The second insulator may have roughly the same thickness on the bottom of the trench as on the sides. It is not a requirement that the second insulator have a uniform thickness, although the second insulator should be continuous.

Figure 9A:
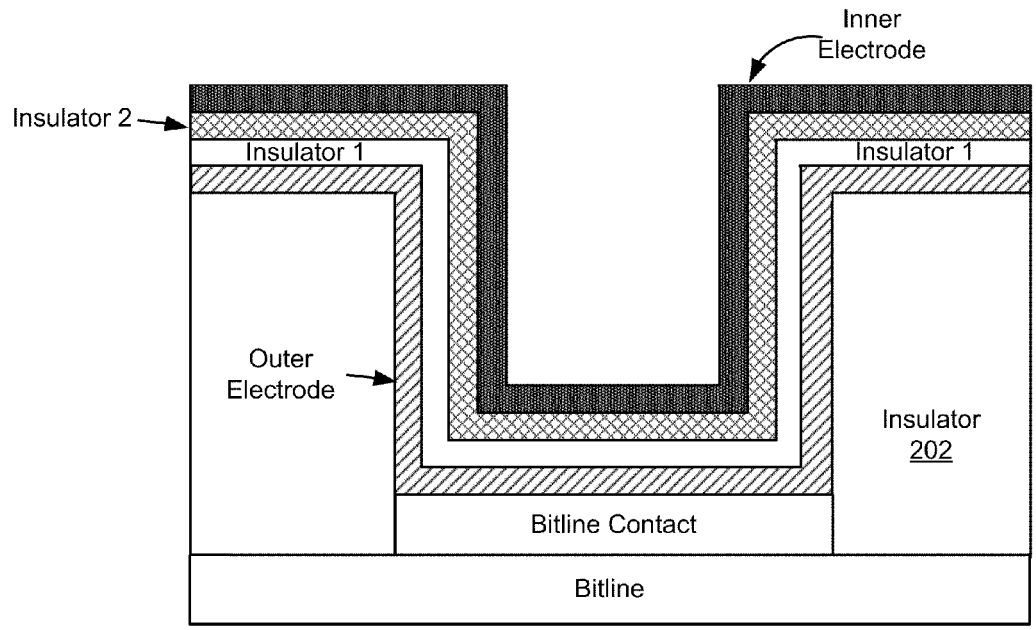
FIG. 9A, FIG. 9B, FIG. 9C, FIG. 9D, and FIG. 9E depict various stages of fabrication of a non-volatile memory cell in accordance with one embodiment.

In step 812, material for the inner electrode is deposited in the trench. In this embodiment, the inner electrode will lie entirely within the trench when processing is complete. The inner electrode may be formed from TiN. However, other materials can be used to form the inner electrode. The material for the inner electrode may be deposited using many different techniques. In one aspect, the inner electrode is formed using atomic layer deposition (ALD). However, it is not required that the inner electrode be deposited as a very thin layer, hence ALD is not required for forming the inner electrode. FIG. 9A depicts the results after step 812.

Note that the result of depositing the inner electrode is that a recess is formed within the inner electrode without having to pattern and etch to form the recess. However, a recess could be formed in the inner electrode by patterning and etching if desired. For example, the material to form the inner electrode could fill trench completely (or possibly have one or more voids). Then, patterning and etching can be used to form the recess within the inner electrode.

In optional step 814, an antifuse is formed within the recess in the inner electrode. In one embodiment, an antifuse is not formed at all.

Figure 9B:
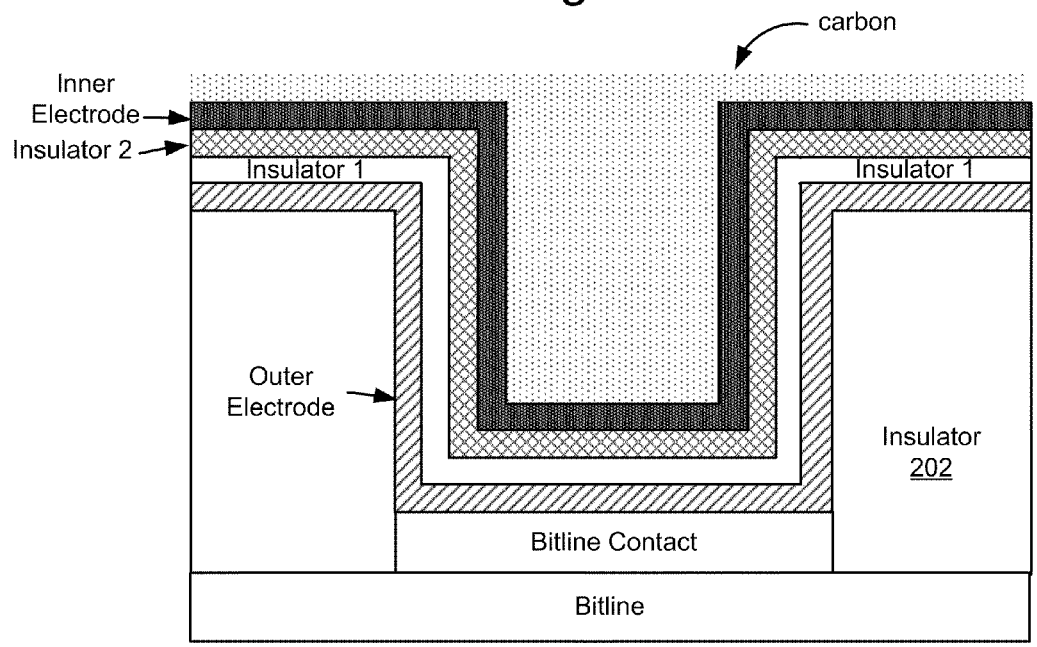

In step 816, material for a state change element 104 is deposited in the trench. Many different types of state change elements can be formed in this step. In one embodiment, a carbon film is deposited. However, it is not required that a carbon film be deposited. For example, carbon nanotubes could be formed in step 816. The carbon can include any combination of graphitic or amorphous carbon. However, it is not required that the state change element be formed from carbon. Many different types of state change elements could be used. In one embodiment, a GST state change element is formed in step 816. The state change material may be deposited by any suitable technique such as Chemical Vapor Deposition (CVD), High Density Plasma (HDP) deposition, plasma enhanced CVD, sputter deposition, etc. FIG. 9B depicts the results after step 816.

Figure 9C:
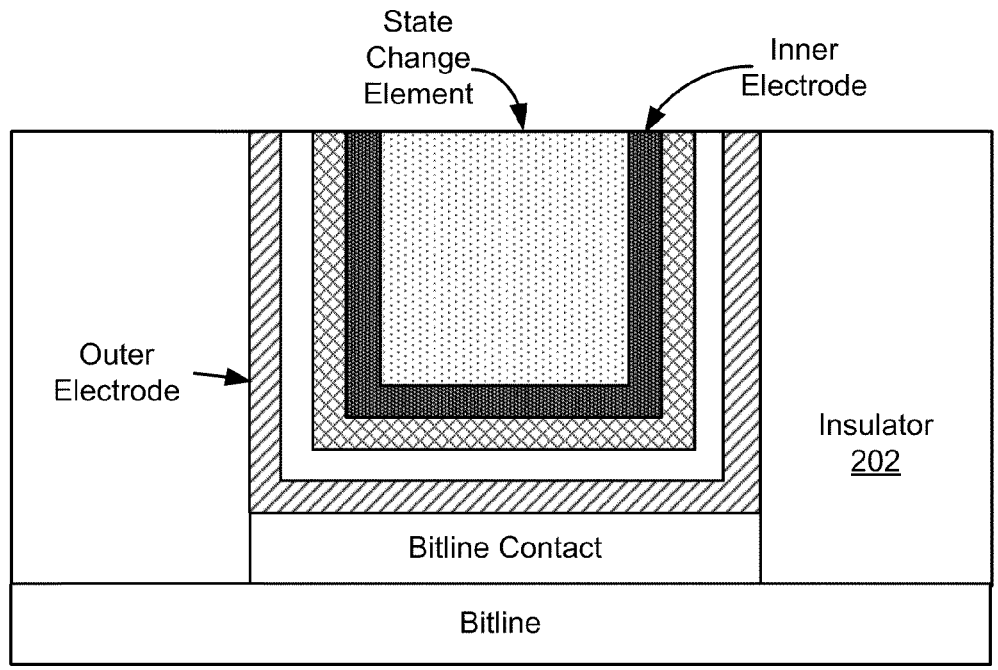

In step 818, excess portions of the material used to form the electrodes, insulators, and state change element are removed. Any suitable technique may be used to remove the excess portions. For example, polishing (e.g., CMP) is performed. FIG. 9C depicts the results after step 818.

Figure 9D:
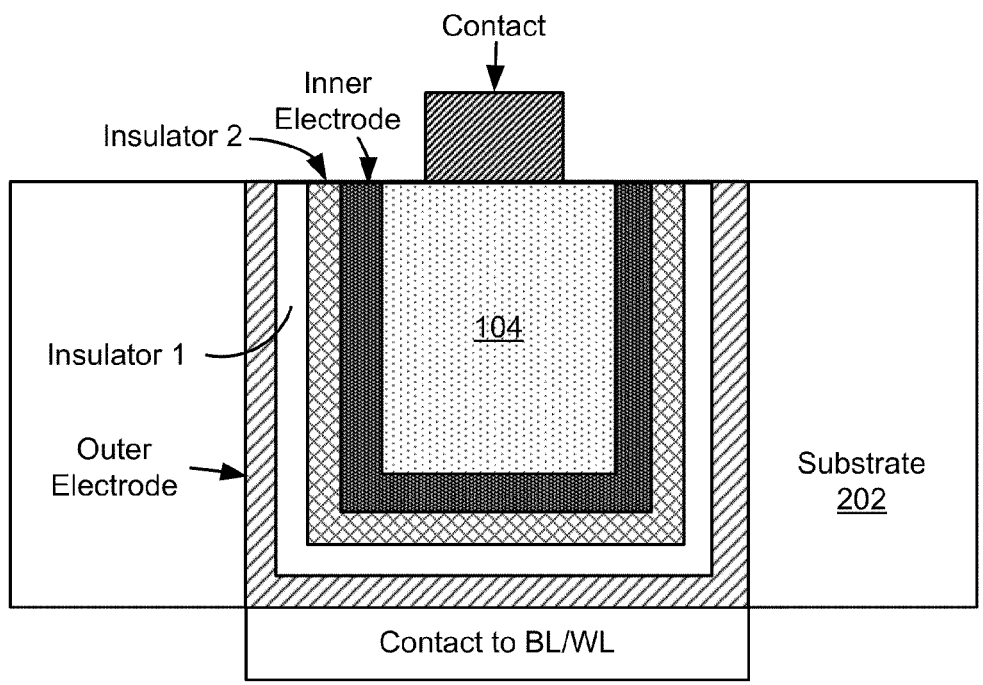

In step 820, a bitline/wordline contact is formed above the state change element 104. The wordline/bitline contact may be formed from TiN, although other materials could be used. Step 820 includes depositing the material for the wordline/bitline contact, patterning, and etching. FIG. 9D depicts results after step 820.

Figure 9E:
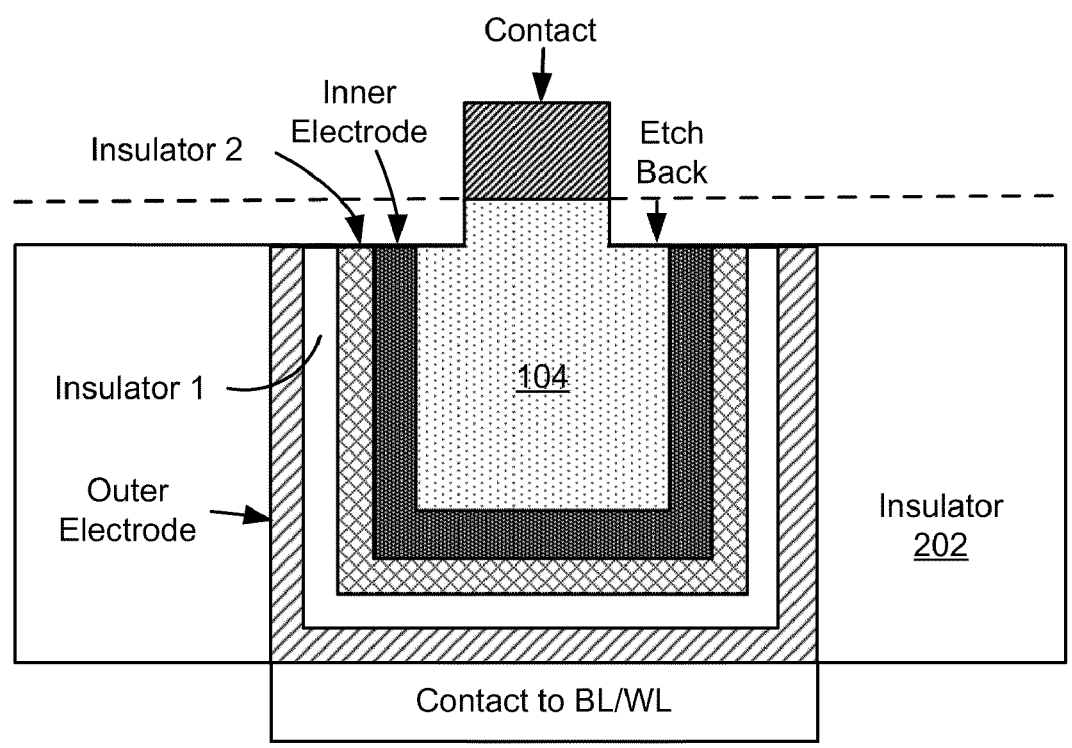

In optional step 822, an etch back is performed to increase the margin between the bitline/wordline contact and the inner electrode. FIG. 9E depicts results after step 822. Note that everything but the portion of the state change element 104 that is below the contact is etched back. The etch back increases the separation between the bitline/wordline contact and the inner electrode, which may help to improve performance.

Figure 10:
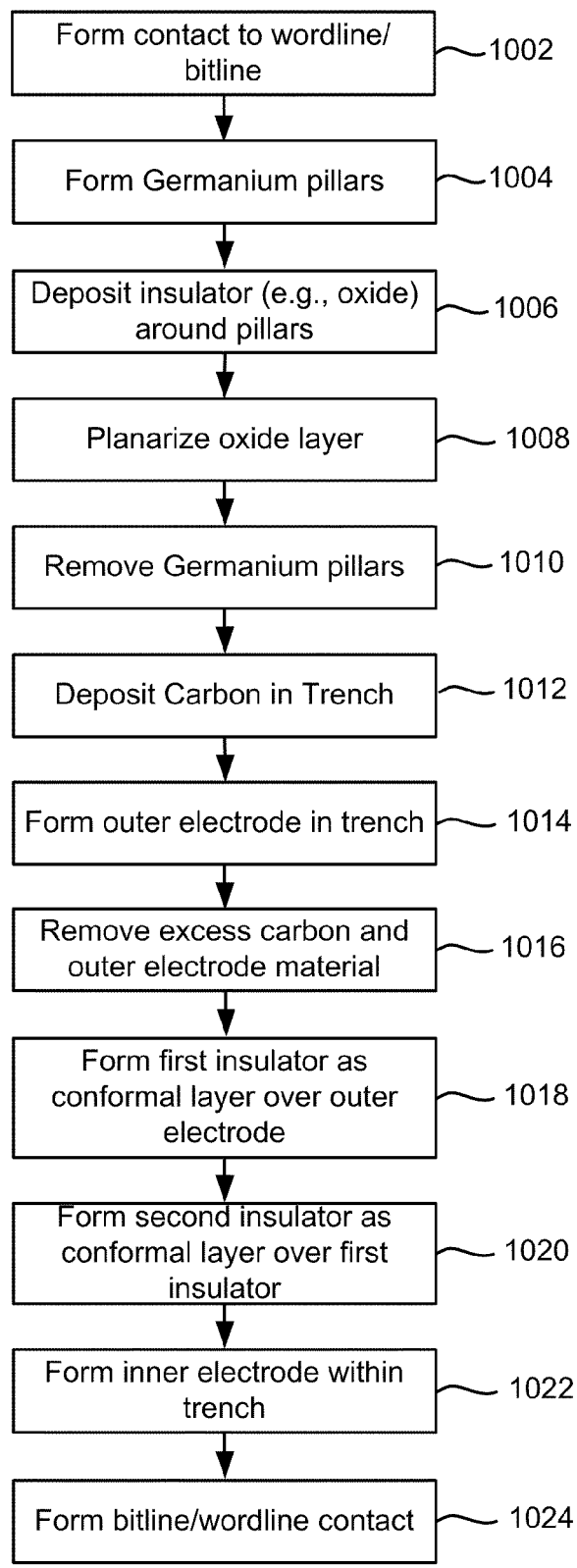
FIG. 10 is a flowchart illustrating steps of one embodiment of a process of fabricating a non-volatile memory cell.

FIG. 10 is a flowchart of one embodiment of a method for forming a MIIM diode and carbon state change element during a single damascene process. The method describes one technique for forming the MIIM diode and carbon memory element depicted in FIG. 11G. FIG. 11A-FIG. 11G are diagrams illustrating various stages of formation during a single damascene process, and will be referred to when discussing FIG. 10.

In step 1002, bit line contacts are formed. In one embodiment, the bit line contacts are formed from TiN. The bit line contacts provide an electrical connection to bit lines (e.g., FIG. 1, 112) (bit lines not depicted in FIGS. 11A-11G). Note that many bit line contacts are associated with a single bit line. The bit line may be formed from tungsten or another highly conductive material such as aluminum. The contacts are referred to as bit line contacts for convenience of description, as the contacts may be word line contacts instead. Thus, in one embodiment, the contacts form an electrical connection to a word line (e.g., FIG. 1, 110).

In step 1004, germanium pillars are formed on top of the bit line contacts. The germanium is deposited, patterned and etched into pillars that reside in regions in which the trenches or vias are to be formed. For example, referring to FIG. 11A, a pillar (not depicted) may be formed over the contact. The pillars can be formed from a material other than germanium.

In step 1006, an insulating material is deposited around the pillars. The insulating material 104 may be $SiO_2$, $Si_3N_4$, or any other suitable insulating and/or dielectric material. The insulating material will serve as the insulator 202. In step 1008, the insulating material is planarized by an etch back process, chemical mechanical polishing (CMP) or the like.

Figure 11A:
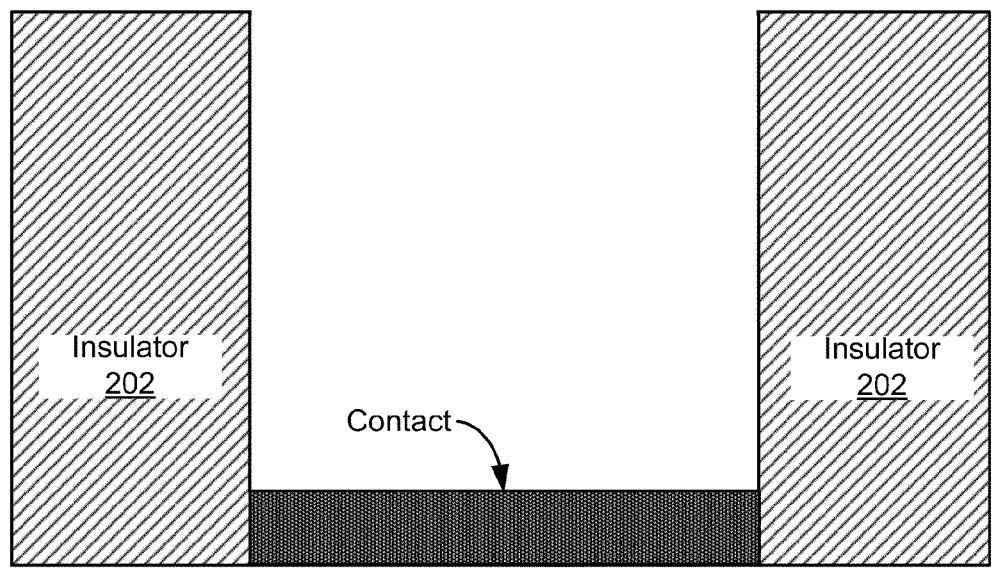
FIG. 11A, FIG. 11B, FIG. 11C, FIG. 11D, FIG. 11E, FIG. 11F, and FIG. 11G depict various stages of fabrication of a non-volatile memory cell in accordance with one embodiment.

After planarization, the germanium pillars may be removed with an ashing or other etching technique to generate the trenches in the insulator 202, in step 1010. FIG. 11A depicts results after step 1010.

An example width for the trench is 22 nanometers. An example depth for the trench is 70 nanometers. However, the trench could have a different width and/or a different depth. Also, note that the aspect ratio of the trench could be higher or lower than this example. FIG. 11A depicts the trench as having a substantially uniform width from top to bottom. However, the trench could have a non-uniform width. As one example, the trench could become progressively narrower towards the bottom.

In other embodiment, pillars are not used to define the trenches. Instead, an insulating material (e.g., $SiO_2$, $Si_3N_4$) is deposited, patterned and etched to form the trenches in the insulating material. The etch may be isotropic or anisotropic.

After the trenches are formed, a carbon material is deposited during the single damascene process, in step 1012. The carbon may be deposited by any suitable technique such as Chemical Vapor Deposition (CVD), High Density Plasma (HDP) deposition, plasma enhanced CVD, sputter deposition from an amorphous or graphite target, etc. In some embodiments, post deposition treatment(s) may be employed such as annealing in reduced pressure or oxygen environments to affect or otherwise improve the properties of the carbon.

In one embodiment, the carbon material is deposited as a carbon film. However, it is not required that a film be deposited. For example, carbon nanotubes could be formed in step 1012. The carbon can include any combination of graphitic and amorphous carbon including mixtures involving CNT, amorphous, and graphitic carbons.

Figure 11B:
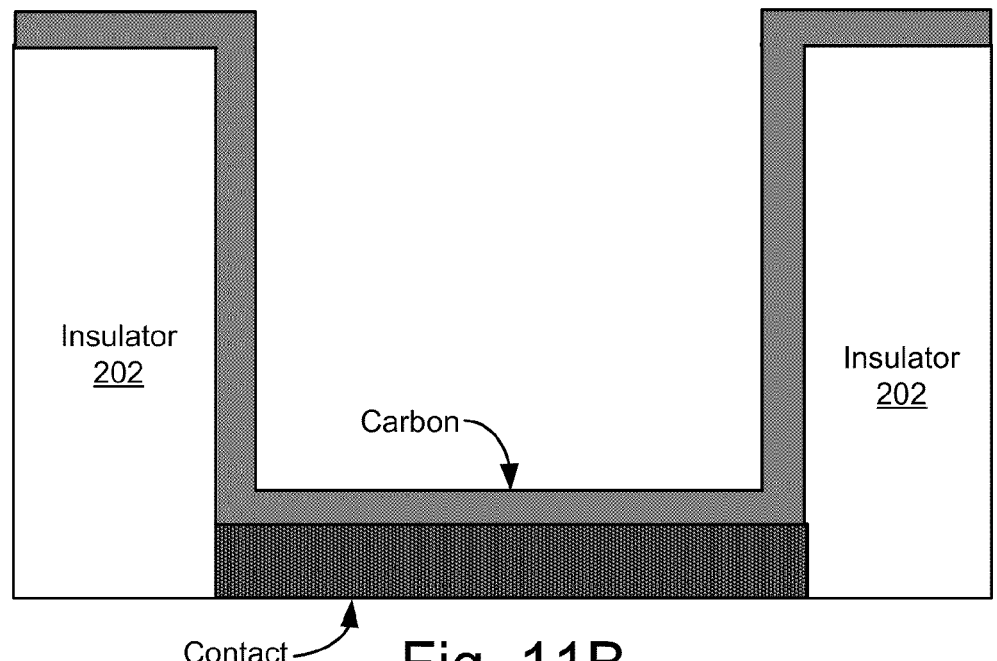

In these or other embodiments, the interface between the carbon and the sidewalls of the trench may be modified to improve adhesion between the carbon and the insulator 202. For example, a thin adhesion layer (not shown) such as TiN, TaN, etc., may be formed over the sidewalls of the trench prior deposition of the carbon. FIG. 11B depicts the results after step 1012. Note that it is not required that the carbon have a uniform thickness. At this point, some of the carbon may extend over the surface of the insulator 202. This portion of the carbon will later be removed.

It is not a requirement that the carbon fully and continuously cover the sidewalls of the trench after deposition of step 1012. In one embodiment, the carbon does not fully and continuously cover the sidewall of the trench. For example, through appropriate control of conditions (e.g., thickness, bias, etc.) in a PECVD process, the carbon is not fully or continuously deposited on the sidewalls. In this case, the carbon is thicker on the bottom of the trench then on the sidewalls. However, the carbon is continuous on the bottom of the trench.

In step 1014, an outer electrode is formed in the trench during the single damascene process. In one aspect, the outer electrode is formed using atomic layer deposition (ALD). However, other techniques can be used to form the outer electrode. In one implementation, the outer electrode is formed from TiN. In one implementation, the work function of the outer electrode is tuned by addition of a suitable material as already described herein. It is not required that the outer electrode be formed from TiN. In one implementation, a diode is formed in which the outer electrode is formed from polysilicon that has been treated to increase its conductivity. As an example, the outer electrode is formed from doped polysilicon. For example, the outer electrode could be n+ doped polysilicon or p+ doped polysilicon.

Figure 11C:
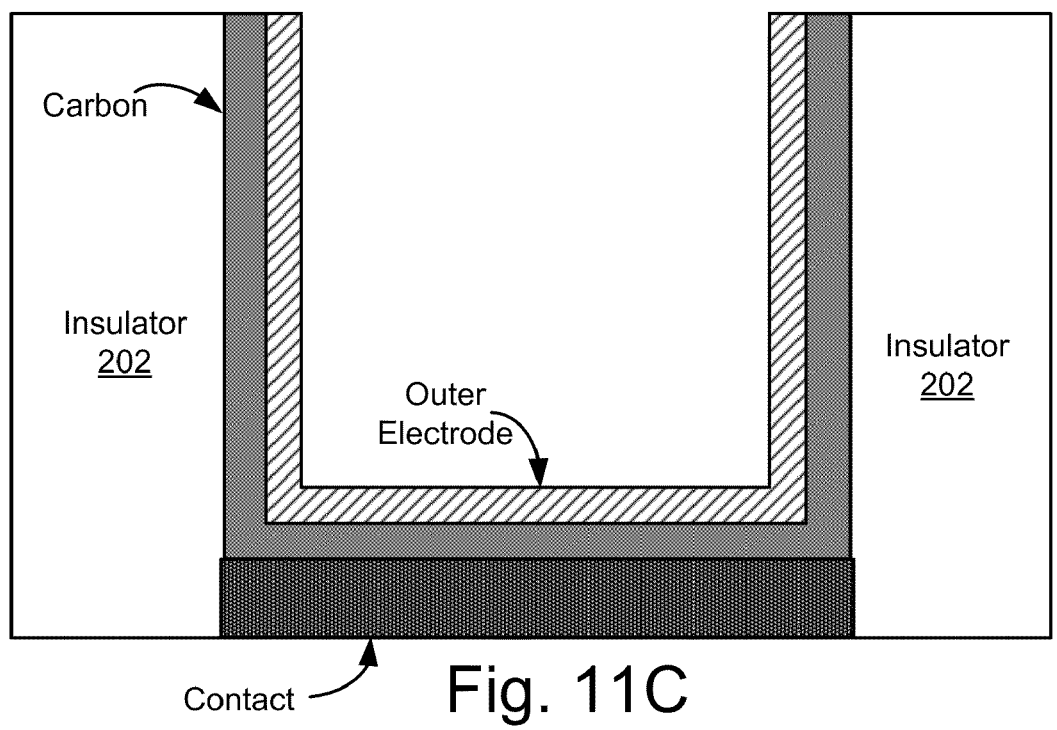

After depositing the material for the outer electrode excess carbon and outer electrode material are removed, in step 1016. For example, polishing (e.g., CMP) is performed to remove portions of the carbon and outer electrode that extend over the insulator 202 beyond the trenches. As another example, an etch back may be performed to remove excess carbon and electrode material that is outside of the trench. FIG. 11C depicts the results after step 1016.

Figure 11D:
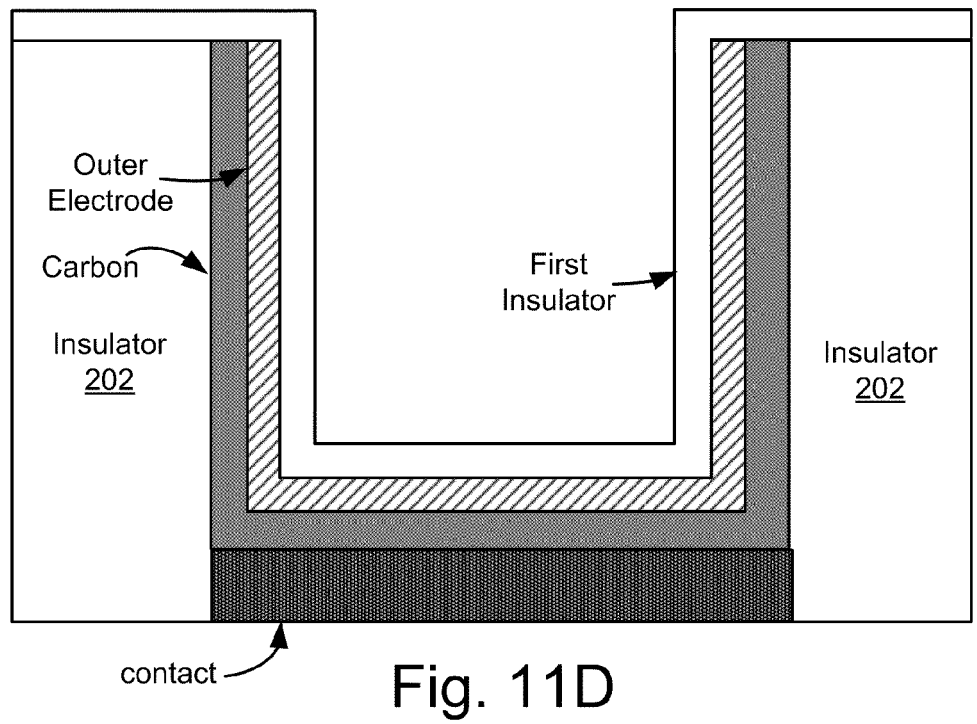

In step 1018, a first insulator layer is formed during the single damascene process. The deposition results in portion of the first insulator as a conformal layer over the inner surface of the outer electrode and another portion of the first insulator over the surface of the insulator 202. In one aspect, the first insulator is formed using atomic layer deposition (ALD). However, other techniques can be used to form the first insulator. The first insulator may be formed from silicon dioxide. As an example, the first insulator can be about 10 Angstroms thick. The first insulator may have roughly the same thickness on the bottom of the trench as on the sides. It is not a requirement that the first insulator have a uniform thickness, although the first insulator should be continuous. FIG. 11D depicts the results after step 1018.

Figure 11E:
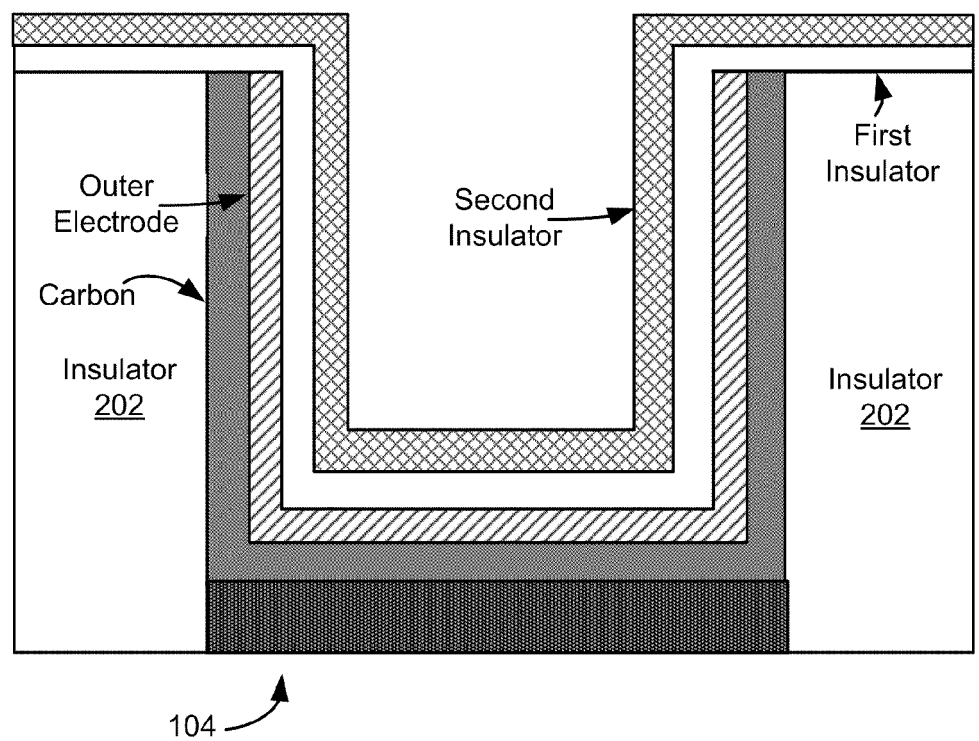

In step 1020, a second insulator layer is formed during the single damascene process. As a result of the deposition a portion of the second insulator forms a conformal layer over the portion of the first insulator that is within the trench. Another portion of the second insulator resides over the portion of the first insulator that extends over the insulator 202 surface. In one aspect, the second insulator is formed using atomic layer deposition (ALD). However, other techniques can be used to form the second insulator. The second insulator may be formed from $HfO_2$. As an example, the second insulator can be about 20 Angstroms thick. The second insulator may have roughly the same thickness on the bottom of the trench as on the sides. It is not a requirement that the second insulator have a uniform thickness, although the second insulator should be continuous. FIG. 11E depicts the results after step 1020.

Figure 11F:
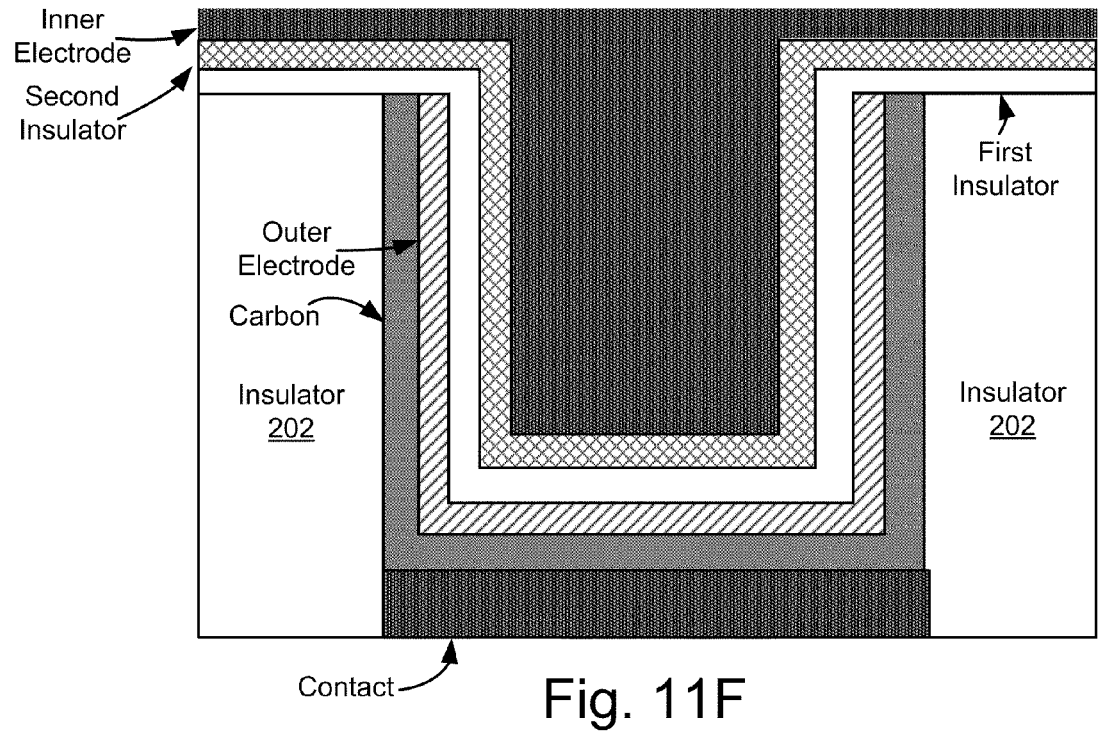

In step 1022, the inner electrode is formed during the single damascene process. Deposition results in a portion of the inner electrode being within the trench and another portion of the inner electrode residing over the portion of the second insulator that extends over the insulator 202 surface. The inner electrode may be formed from TiN. However, other materials can be used to form the inner electrode. The material for the inner electrode may be depositing using many different techniques. In one aspect, the inner electrode is formed using atomic layer deposition (ALD). However, it is not required that the inner electrode be deposited as a very thin layer, hence ALD is not required for forming the inner electrode. After depositing the material for the inner electrode, the surface of the inner electrode may be planarized by, for example, CMP. FIG. 11F depicts the results after step 1022.

Figure 11G:
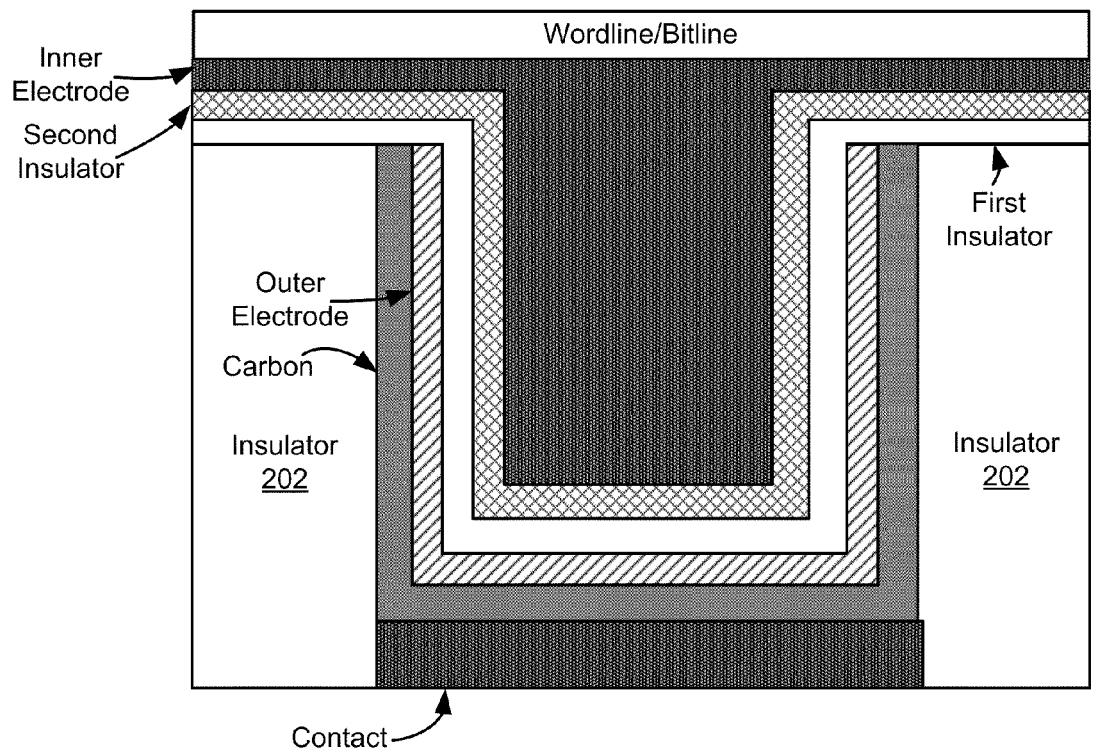

In step 1024, a wordline/bitline is formed over top of the inner electrode. The wordline/bitline may be formed from Tungsten or Aluminum, or other materials could be used. Step 1024 includes depositing the material for the wordline/bitline, patterning, and etching. Techniques for patterning and etching wordlines/bitlines are well known and will not be discussed in detail. The result after performing step 1024 is depicted in FIG. 11G.

Embodiments herein have been described as forming diodes and memory elements in a trench that is surrounded by an insulator. In one embodiment, the trench is disposed in a substrate, such as a silicon substrate. The trench may be lined with an insulating material in this embodiment.

In one embodiment, a memory cell is formed by performing the following steps. A trench is formed. A MIIM diode is formed in the trench during a damascene process. The MIIM diode includes a first diode electrode, a first insulating region, a second insulating region, and a second diode electrode. A region of carbon is formed in the trench during the damascene process. At least a portion of the carbon is electrically in series with the MIIM diode.

In one embodiment, a memory cell is formed in accordance with the following steps. A trench having a bottom and a sidewall is formed. A region of carbon is formed over the bottom of the trench and adjacent to the sidewall. A first diode electrode is formed as a conformal layer over the carbon. A first insulating region is formed as a conformal layer over the first diode electrode. A second insulating region is formed as a conformal layer over the first insulating material. A second diode electrode is formed in the trench. The first insulating material and the second insulating material reside between the first diode electrode and the second diode electrode to form a metal-insulator-insulator-metal (MIIM) diode.

In still another embodiment, a memory cell is formed by performing the following steps. A trench having a bottom and sidewalls is formed. A first diode electrode is formed in the trench during a damascene process, the first diode electrode forming a conformal layer over the bottom and sidewalls of the trench. A first insulating region is formed in the trench during the damascene process. The first insulating material forms a conformal layer over the first diode electrode. A second insulating region is formed in the trench during the damascene process, the second insulating material forming a conformal layer over the first insulating material. A second diode electrode is formed in the trench during the damascene process, the first insulating region and the second insulating region reside between the first diode electrode and the second diode electrode to form a metal-insulator-insulator-metal (MIIM) diode. A region of carbon is formed in the trench within the MIIM diode during the damascene process.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method comprising:
    forming a trench;
    forming a MIIM diode in the trench during a damascene process, the MIIM diode including a first diode electrode, a first insulating region, a second insulating region, and a second diode electrode; and
    forming a region of carbon in the trench during the damascene process, at least a portion of the carbon is electrically in series with the MIIM diode.

2. The method as recited in claim 1, wherein the trench has a bottom and sidewalls, the forming a region of carbon in the trench during the damascene process includes depositing a layer of carbon over the bottom and the sidewalls of the trench.

3. The method as recited in claim 2, further comprising:
    forming a conductive contact prior to forming the region of carbon, at least a portion of the carbon resides between the conductive contact and the first diode electrode to form a reversible resistance-switching element.

4. The method as recited in claim 3, wherein the forming a conductive contact includes forming the conductive contact in the trench.

5. The method as recited in claim 1, wherein the forming a region of carbon in the trench during the damascene process includes forming the region of carbon inside of the MIIM diode.

6. A method as recited in claim 5, further comprising:
    planarizing the region of carbon, the planarized region of carbon has a top surface;
    forming a conductive contact over at least a portion of the top surface of the carbon, the conductive contact does not cover the second diode electrode; and
    etching back the second diode electrode and portions of the carbon that are not covered by the conductive contact.

7. A method as recited in claim 5, further comprising:
    forming a conductive contact after forming the region of carbon, at least a portion of the carbon resides between the conductive contact and the second diode electrode to form a reversible resistance-switching element.

8. A method as recited in claim 5, wherein forming a MIIM diode in the trench during a damascene process and the forming a region of carbon in the trench during the damascene process includes planarizing the first diode electrode, the first insulating region, the second insulating region, the second diode electrode, and the region of carbon, and further comprising forming a conductive contact after the planarizing.

9. A method as recited in claim 1, wherein the forming a region of carbon includes depositing a film of carbon.

10. A method as recited in claim 1, wherein the forming a region of carbon in the trench includes depositing carbon in the trench and over an insulator outside the trench and removing excess portions of the carbon that reside outside of the trench.

11. A method as recited in claim 1, wherein the forming a region of carbon includes depositing the carbon by chemical vapor deposition (CVD).

12. A method as recited in claim 1, wherein the forming a region of carbon includes depositing the carbon by plasma enhanced chemical vapor deposition (PECVD).

13. A method comprising:
    forming a trench, the trench having a bottom and a sidewall;

forming a region of carbon over the bottom of the trench and adjacent to the sidewall;

forming a first diode electrode as a conformal layer over the carbon;

forming a first insulating region as a conformal layer over the first diode electrode;

forming a second insulating region as a conformal layer over the first insulating material; and forming a second diode electrode in the trench, the first insulating material and the second insulating material reside between the first diode electrode and the second diode electrode to form a metal-insulator-insulator-metal (MIIM) diode.

14. A method as recited in claim 13, further comprising:
forming a conductive contact prior to forming the carbon, at least a portion of the carbon resides between the conductive contact and the first diode electrode.

15. A method as recited in claim 13, wherein the forming a first diode electrode and the forming a second diode electrode include depositing TiN.

16. A method as recited in claim 13, wherein the forming a first diode electrode and the forming a second diode electrode include forming regions of doped silicon.

17. A method as recited in claim 13, wherein the forming a region of carbon includes depositing a film of carbon.

18. A method as recited in claim 13, wherein the forming a region of carbon includes depositing graphitic carbon.

19. A method as recited in claim 13, wherein the forming a region of carbon includes depositing amorphous carbon.

20. A method comprising:
forming a trench, the trench having a bottom and sidewalls;

forming a first diode electrode in the trench during a damascene process, the first diode electrode forming a conformal layer over the bottom and sidewalls of the trench;

forming a first insulating region in the trench during the damascene process, the first insulating material forming a conformal layer over the first diode electrode;

forming a second insulating region in the trench during the damascene process, the second insulating material forming a conformal layer over the first insulating material; and forming a second diode electrode in the trench during the damascene process, the first insulating region and the second insulating region reside between the first diode electrode and the second diode electrode to form a metal-insulator-insulator-metal (MIIM) diode; and forming a region of carbon in the trench within the MIIM diode during the damascene process.

* * * * *